US011825685B2

(12) United States Patent
Lee

(10) Patent No.: US 11,825,685 B2
(45) Date of Patent: Nov. 21, 2023

(54) DISPLAY DEVICE

(71) Applicant: Samsung Display Co., Ltd., Yongin-si (KR)

(72) Inventor: Hyeon Bum Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 166 days.

(21) Appl. No.: 17/165,855

(22) Filed: Feb. 2, 2021

(65) Prior Publication Data
US 2021/0242423 A1    Aug. 5, 2021

(30) Foreign Application Priority Data

Feb. 3, 2020 (KR) .......................... 10-2020-0012781

(51) Int. Cl.
| H10K 50/844 | (2023.01) |
| H10K 50/86 | (2023.01) |
| H10K 59/38 | (2023.01) |
| H10K 59/122 | (2023.01) |
| H10K 59/131 | (2023.01) |

(52) U.S. Cl.
CPC ......... *H10K 50/844* (2023.02); *H10K 50/865* (2023.02); *H10K 59/122* (2023.02); *H10K 59/131* (2023.02); *H10K 59/38* (2023.02)

(58) Field of Classification Search
CPC ............... H01L 27/323; H01L 27/3258; H01L 27/3276; H01L 27/3246; H01L 51/5284; H01L 51/5253; H10K 59/131; H10K 59/122; H10K 59/38; H10K 50/865; H10K 50/844
See application file for complete search history.

(56) References Cited

U.S. PATENT DOCUMENTS

| 10,310,650 | B2 | 6/2019 | Heo et al. | |
| 2017/0229528 | A1* | 8/2017 | Ota | ....................... H10K 59/122 |
| 2018/0033830 | A1 | 2/2018 | Kim et al. | |
| 2018/0182816 | A1* | 6/2018 | Kang | .................... G06F 3/0443 |

(Continued)

FOREIGN PATENT DOCUMENTS

| KR | 10-1479769 | 1/2015 |
| KR | 10-2018-0014398 | 2/2018 |

(Continued)

*Primary Examiner* — Vongsavanh Sengdara

(74) *Attorney, Agent, or Firm* — H.C. Park & Associates, PLC

(57) ABSTRACT

A display device includes a first layer having a display area including pixels and a non-display area surrounding the display area; a second layer disposed on the first layer and including an intermediate inorganic film and an intermediate organic film; a third layer disposed on the second layer and including display elements; a first dam structure disposed outside an edge of the intermediate organic film and extending along the edge of the intermediate organic film; a fourth layer including first and second encapsulation inorganic films; a fifth layer in disposed on the fourth layer; a sixth layer disposed on the fifth layer and including a light blocking layer, a plurality of color filters, and a seventh layer covering the light blocking layer and the plurality of color filters; and a second dam structure disposed on the non-display area and defining a boundary of the seventh layer.

18 Claims, 17 Drawing Sheets

(56) References Cited

U.S. PATENT DOCUMENTS

| | | | | |
|---|---|---|---|---|
| 2019/0196619 A1* | 6/2019 | Baek | ............... | H10K 50/844 |
| 2019/0219881 A1* | 7/2019 | Shrivastava | ......... | H05K 9/0005 |
| 2019/0252639 A1* | 8/2019 | Lee | ............... | G06F 3/044 |
| 2019/0267433 A1* | 8/2019 | An | ............... | H01L 27/3248 |
| 2019/0341428 A1* | 11/2019 | Lee | ............... | H10K 50/8445 |
| 2019/0361555 A1* | 11/2019 | Lee | ............... | G02F 1/133528 |
| 2021/0327912 A1* | 10/2021 | Hu | ............... | H01L 27/1262 |

FOREIGN PATENT DOCUMENTS

| | | |
|---|---|---|
| KR | 10-2018-0074980 | 7/2018 |
| KR | 10-2050462 | 12/2019 |

\* cited by examiner

DISPLAY DEVICE

CROSS-REFERENCE TO RELATED APPLICATION

This application claims priority from and the benefit of Korean Patent Application No. 10-2020-0012781, filed on Feb. 3, 2020, which is hereby incorporated by reference for all purposes as if fully set forth herein.

BACKGROUND

Field

Exemplary implementations of the invention relate generally to a display device and more specifically, to a display device with an anti-reflection member.

Discussion of the Background

A display device displays an image. The display device includes a display panel such as an organic light emitting display panel or a liquid crystal display panel includes an organic light emitting diode (OLED) element or a quantum dot electroluminescence (QD-EL) element.

A mobile electronic device often includes a display device to provide an image to a user. of the number of mobile electronic devices having a larger display screen with the same or smaller volume or thickness than that of conventional mobile electronic devices, is increasing, and a foldable display device, which is capable of being folded and unfolded to provide a larger screen only while being used, is also being developed.

Recently, in order to improve the folding characteristics and light efficiency of the foldable display device, a method of utilizing an anti-reflection member using a light blocking layer and a color filter instead of a thick polarizing plate has been studied.

The above information disclosed in this Background section is only for understanding of the background of the inventive concepts, and, therefore, it may contain information that does not constitute prior art.

SUMMARY

Applicant discovered that when a polarizing plate is used in manufacturing of a display device, the polarizing plate may increase the thickness of the display device and to reduce light efficiency of the display device.

Display devices constructed according to the principles and exemplary implementations of the invention are capable of reducing the thickness of the display panel and preventing a reduction in luminance. Fro example, an anti-reflection member constructed according to principles and some exemplary implementations of the invention includes a light blocking layer and a color filter, thereby obviating the need for another polarizing plate.

Methods of fabricating an anti-reflection member according to the principles of the invention are capable of reducing the number of mask processes for forming the anti-reflection member, thereby reducing manufacturing cost and complexity. For example, according to principles and some exemplary implementations of the invention, a dam structure for forming a boundary of the overcoat layer is simultaneously formed during a patterning process of the light blocking layer and the color filter of the anti-reflection member, and thus the display device is capable of forming the anti-reflection member by using a mask process that is reduced compared to number of processes required the related art.

Additional features of the inventive concepts will be set forth in the description which follows, and in part will be apparent from the description, or may be learned by practice of the inventive concepts.

According to one aspect of the invention, a display device includes a first layer having a display area including pixels and a non-display area surrounding the display area; a second layer disposed on the first layer and including an intermediate inorganic film and an intermediate organic film, the intermediate inorganic film overlapping the display area and the non-display area, the intermediate organic film disposed on the intermediate inorganic film and exposing a portion of the intermediate inorganic film in the non-display area; a third layer disposed on the second layer and including display elements in the display area; a first dam structure disposed outside an edge of the intermediate organic film and extending along the edge of the intermediate organic film; a fourth layer including a first encapsulation inorganic film and a second encapsulation inorganic film overlapping the third layer and the first dam structure, respectively, and an encapsulation organic film interposed between the first encapsulation inorganic film and the second encapsulation inorganic film and having an end portion adjacent to a side of the first dam structure; a fifth layer in disposed on the fourth layer; a sixth layer disposed on the fifth layer and including a light blocking layer, a plurality of color filters, and a seventh layer covering the light blocking layer and the plurality of color filters; and a second dam structure disposed on the non-display area and defining a boundary of the seventh layer, wherein the second dam structure is formed of the same material as at least one of the light blocking layer and the plurality of color filters.

The second layer may be a circuit element layer and may include signal lines electrically connected to the display elements, and signal pads connected to ends of the signal lines, and the non-display area may have a pad area in which the signal pads are disposed.

A portion of the first dam structure and a portion of the second dam structure may be disposed substantially in parallel with the pad area.

The second dam structure may be disposed between the display area and the pad area.

The first dam structure may include a first dam portion and the second dam structure comprises a second dam portion overlapping the first dam portion.

Each pixel may include a first sub pixel to emit first color light; a second sub pixel to emit second color light; and a third sub pixel to emit third color light, and wherein the color filters may include: a first color filter overlapping the first sub pixel; a second color filter overlapping the second sub pixel; and a third color filter overlapping the third sub pixel.

The second dam structure may include an eighth layer, a ninth layer, a tenth layer and an eleventh layer, and wherein: the eighth layer may be simultaneously formed of the same material as the light blocking layer, the ninth layer may be simultaneously formed of the same material as the first color filter, the tenth layer may be simultaneously formed of the same material as the second color filter, and the eleventh layer may be formed of the same material as the third color filter.

The first color filter may be a green color filter, the second color filter may be a blue color filter, and the third color filter may be a red color filter.

The seventh layer may be an overcoat layer further including a scatterer formed of at least one selected from TiO2, Al2O3, and SiO2.

The third layer may include a display element layer further including a pixel definition film having an opening defining an emission area.

The display device may further include a spacer projecting in a thickness direction from the pixel definition film, wherein the first dam structure may include an eighth layer and a ninth layer, the eighth layer simultaneously formed of the same material as the pixel definition film, the ninth layer simultaneously formed of the same material as the spacer.

The light blocking layer may overlap the pixel definition film in a thickness direction.

The light blocking layer may have a first width between its ends in one direction, the pixel definition film may have a second width between its ends in the one direction, and the first width may be less than the second width.

The pixel definition film may include a light absorbing material, and the light absorbing material comprises at least one selected from a carbon-based black pigment, chromium (Cr), molybdenum (Mo), an alloy of molybdenum and titanium (MoTi), tungsten (W), vanadium (V), niobium (Nb), tantalum (Ta), manganese (Mn), cobalt (Co), and nickel (Ni).

The intermediate organic film may include a first intermediate organic film disposed on the intermediate inorganic film, and a second intermediate organic film disposed on the first intermediate organic film.

The non-display area may include a first non-bendable area, a second non-bendable area spaced apart from the first non-bendable area in a first direction, and a bendable area defined between the first non-bendable area and the second non-bendable area, and wherein the bendable area may be bent such that a bending axis may be defined along a second direction orthogonal to the first direction.

The intermediate inorganic film may have a groove that exposes a portion of the non-display area of the first layer, and a dummy organic pattern is disposed inside the groove.

The second layer may be a circuit element layer and comprises signal lines electrically connected to the display elements, and signal pads connected to ends of the signal lines, and the second non-bendable area may include a pad area in which the signal pads are disposed.

The second dam structure may be disposed in the first non-bendable area.

The second dam structure may include a first dam portion and the second dam structure comprises a second dam portion overlapping the first dam portion.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
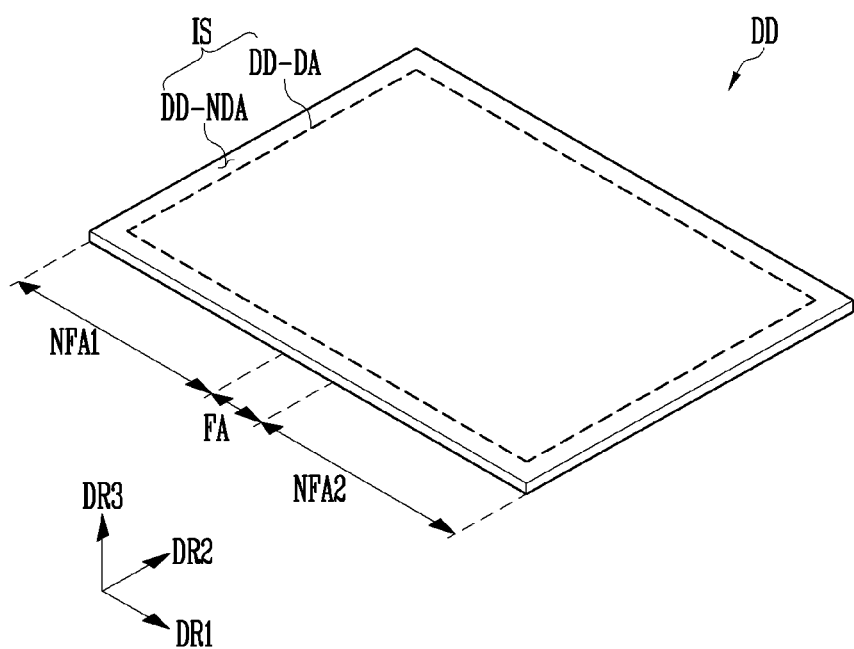
FIG. 1 is a perspective view of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/of" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, specific embodiments will be described with reference to the accompanying drawings.

Figure 2:
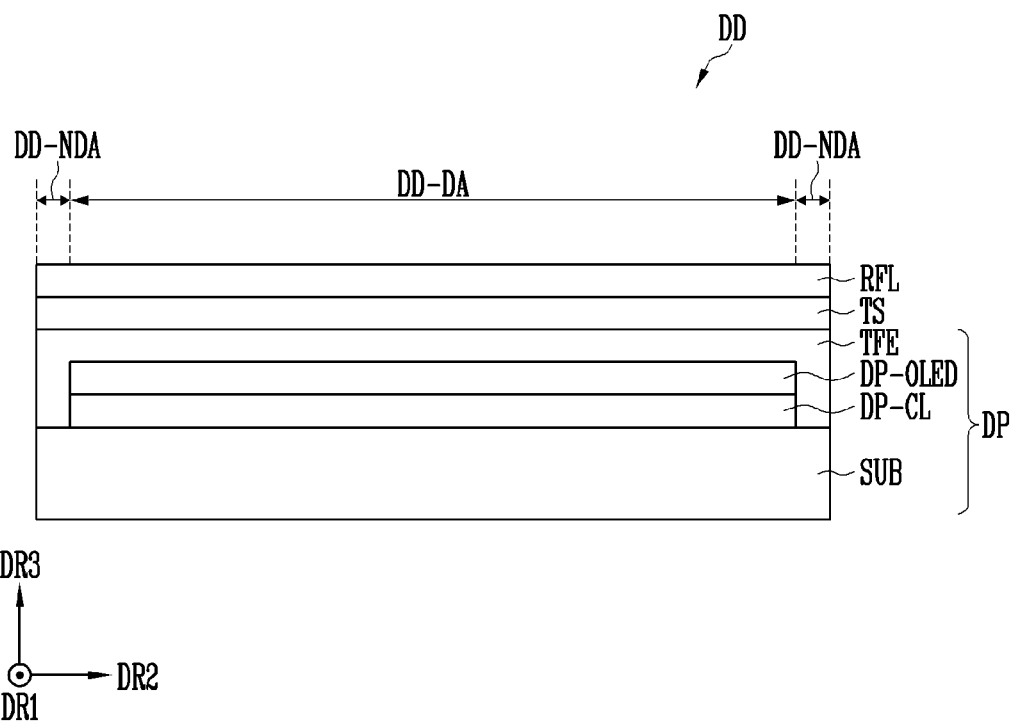
FIG. 2 is a cross-sectional view of the display device of FIG. 1.

FIG. 1 is a perspective view of a display device DD constructed according to the principles of the invention. FIG. 2 is a cross-sectional view of the display device DD of FIG. 1.

As shown in FIG. 1, a display surface IS may be parallel to a surface defined by a first direction DR1 and a second direction DR2. A third direction DR3 may indicate a normal direction of the display surface IS, i.e., a thickness direction of the display device DD. A front surface (or an upper surface) and a back surface (or a lower surface) of each of members are separated in the third direction DR3. However, the directions indicated by the first to third directions DR1, DR2, and DR3 are relative directions, and may be converted into other direction. Hereinafter, first to third directions may refer to the same reference numerals as the first to third directions DR1, DR2, and DR3, respectively for descriptive convenience.

The display device DD according to an exemplary embodiment may be a flexible display device DD. For example, the display device DD may include a flexible substrate. The flexible substrate may be one of a film substrate and a plastic substrate including a polymer organic material. For example, the substrate may be a polyimide film. The display device DD may be divided into a plurality of areas according to folding and unfolding positions. For example, the display device DD may be divided into a foldable area FA in which the display device DD is folded, and two non-foldable areas NFA1 and NFA2, which are substantially flat. The non-foldable areas NFA1 and NFA2 are arranged along the first direction DR1, and the foldable area FA is disposed between the two non-foldable areas NFA1 and NFA2. In the illustrated exemplary embodiment, one foldable area FA is defined in the display device DD. However, exemplary embodiments are not limited thereto, and a plurality of foldable areas may be defined in the display device DD. The display device DD may be applied to a large electronic device such as a television, and a monitor, and a small and medium-size electronic device such as a mobile phone, a tablet, a car navigation device, a game machine, a smart watch, and the like.

As shown in FIG. 1, the display device DD may include a display area DD-DA on which an image is displayed, and a non-display area DD-NDA adjacent to the display area DD-DA. The non-display area DD-NDA is an area where an image is not displayed. The display area DD-DA may have a generally quadrangle shape. The non-display area DD-NDA may surround the display area DD-DA. However, exemplary embodiments are not limited thereto, and the shapes of the display area DD-DA and the non-display area DD-NDA may be relatively designed.

Referring to FIG. 2, the display device DD may include a display panel DP, a touch sensing unit TS (or a touch sensing layer), and an anti-reflection layer RFL. The display device DD may further include a protective member disposed on a lower surface of the display panel DP, and a window member disposed on an upper surface of the anti-reflection layer RFL.

The display panel DP may be a light emitting display panel, but exemplary embodiments are not limited thereto. For example, the display panel DP may be an organic light emitting display panel or a quantum dot light emitting display panel. In the organic light emitting display panel, an emission layer may include an organic light emitting material. In the quantum dot light emitting display panel, the emission layer may include a quantum dot and a quantum rod. Hereinafter, the display panel DP will be described as the organic light emitting display panel for descriptive convenience.

The display panel DP may include a base layer SUB, a circuit element layer DP-CL disposed on the base layer SUB, a display element layer DP-OLED, and a thin film encapsulation layer TFE. For example, the display panel DP may further include functional layers such as an anti-reflection layer, and a refractive index control layer.

The base layer SUB may include at least one plastic film. The base layer SUB is a flexible substrate and may include a plastic substrate, a glass substrate, a metal substrate, an organic/inorganic composite substrate, or the like.

The display area DD-DA and the non-display area DD-NDA described with reference to FIG. 1 may be identically defined in the base layer SUB.

The circuit element layer DP-CL may include at least one intermediate insulating layer and a circuit element. The intermediate insulating layer may include at least one intermediate inorganic film and at least one intermediate organic film. The circuit element may include signal lines, a driving circuit of a pixel, and the like. Detailed description thereof will be provided below.

The display element layer DP-OLED may include at least organic light emitting diodes. The display element layer DP-OLED may further include an organic film such as a pixel definition film.

The thin film encapsulation layer TFE may seal the display element layer DP-OLED. The thin film encapsulation layer TFE may include at least one inorganic film (hereinafter, referred to as an encapsulation inorganic film). The thin film encapsulation layer TFE may further include at least one organic film (hereinafter, referred to as an encapsulation organic film). The encapsulation inorganic film may protect the display element layer DP-OLED from moisture or oxygen. Further, the encapsulation organic film may protect the display element layer DP-OLED from foreign substance such as a dust particle. The encapsulation inorganic film may include a silicon nitride layer, a silicon oxy nitride layer and a silicon oxide layer, a titanium oxide layer, an aluminum oxide layer, or the like. The encapsulation organic film may include an acryl-based organic film, but exemplary embodiments are not limited thereto.

The touch sensing unit TS may obtain coordinate information of an external input. The touch sensing unit TS is disposed directly on the organic light emitting display panel DP. As used herein, "directly disposed" means formed by a continuous process without using a separate adhesive layer. In another exemplary embodiment, the touch sensing unit TS is disposed indirectly on the organic light emitting display panel DP, so that and intermediate layer, such as an adhesive layer may be disposed therebetween.

The touch sensing unit TS may have a multilayer structure. The touch sensing unit TS may include a single conductive layer or multiple conductive layers. The touch sensing unit TS may include a single insulating layer or multiple insulating layers.

For example, the touch sensing unit TS may sense an external input in a capacitive method. However, the operational method of the touch sensing unit TS is not particularly limited thereto. In an exemplary embodiment, the touch sensing unit TS may sense the external input in an electromagnetic induction method or a pressure sensing method.

The anti-reflection layer RFL may be disposed on the touch sensing unit TS. The anti-reflection layer RFL may serve to prevent reflection of external light. For example, the anti-reflection layer RFL may include a light blocking layer formed of a light blocking material. Accordingly, since a separate polarizing plate can be omitted in favor of the anti-reflection layer RFL, the thickness of the display panel DP may be minimized while preventing a reduction in luminance of the display device DD. Detailed description of the anti-reflection layer RFL will be provided later with reference to FIGS. 8A to 8C.

Figure 3:
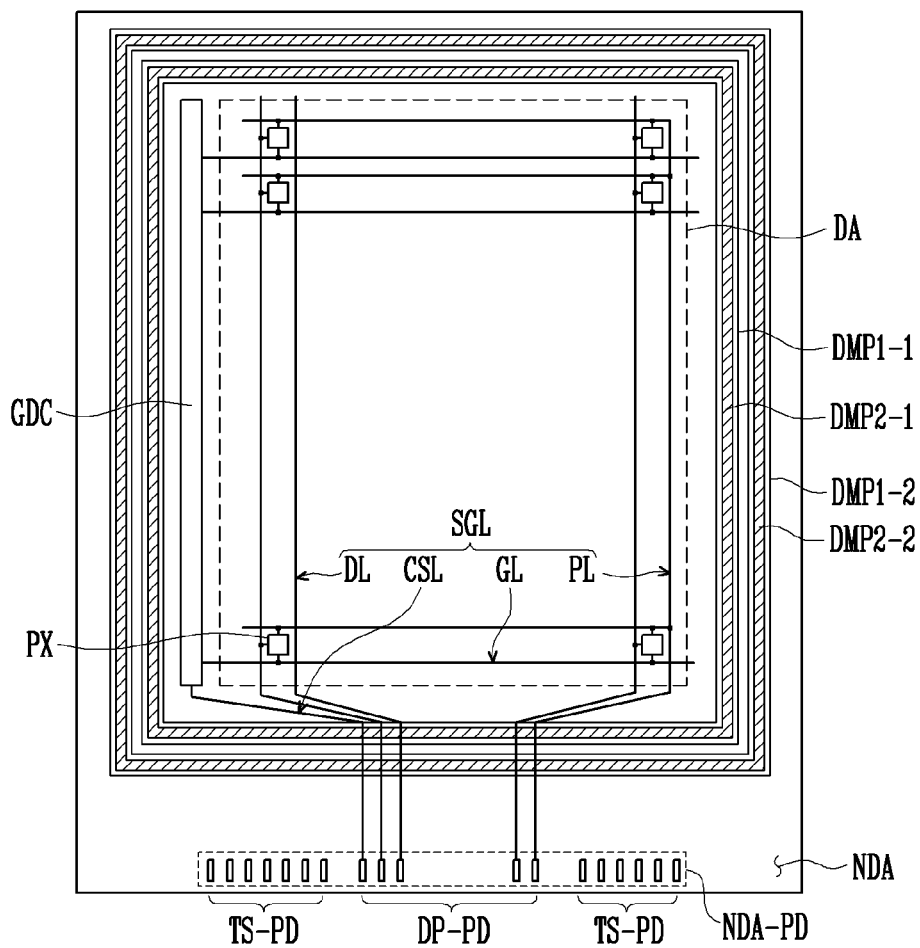
FIG. 3 is a plan view of a display panel of FIG. 2.
Figure 4:
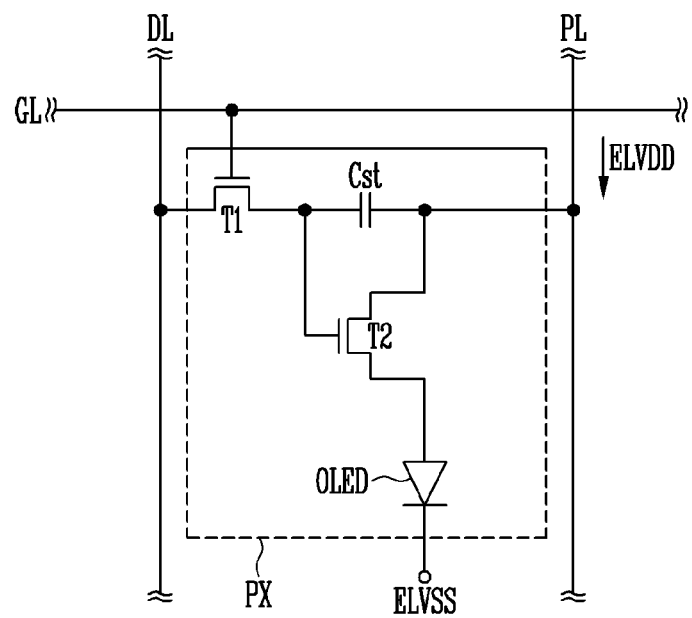
FIG. 4 is an equivalent circuit diagram of a representative pixel of FIG. 3.
Figure 5:
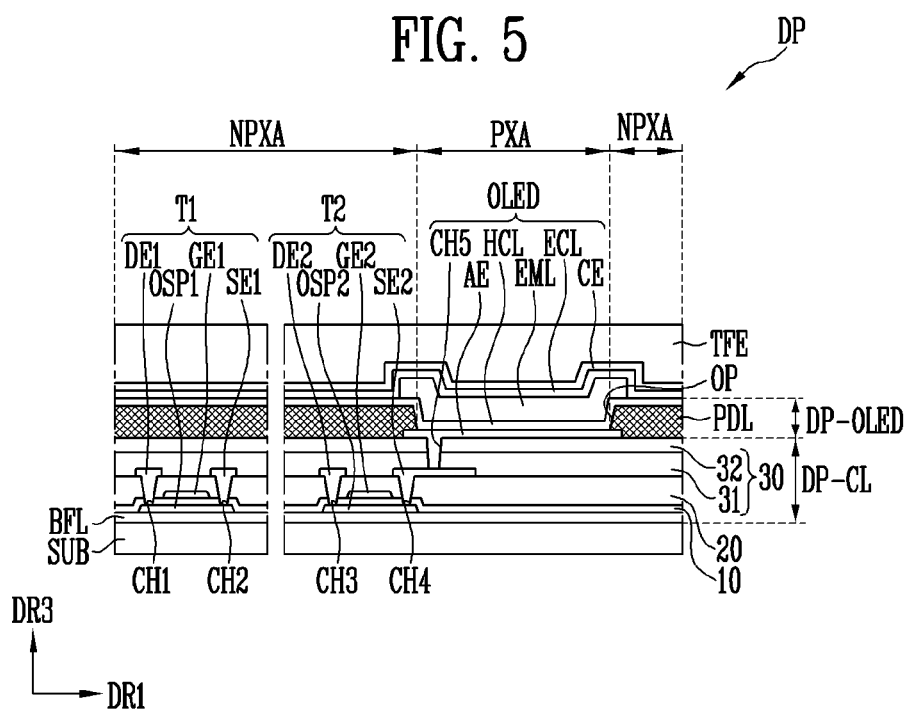
FIG. 5 is an enlarged cross-sectional view of the display panel of FIG. 2.

FIG. 3 is a plan view of the display panel DP of FIG. 2. FIG. 4 is an equivalent circuit diagram of a representative pixel PX of FIG. 3. FIG. 5 is an enlarged cross-sectional view of the display panel DP of FIG. 2.

As shown in FIG. 3, the display panel DP may include a display area DA and a non-display area NDA. In an exemplary embodiment, the non-display area NDA may be defined along an edge of the display area DA. The display area DA and the non-display area NDA of the display panel DP may correspond to the display area DD-DA and the non-display area DD-NDA of the display device DD shown in FIG. 1, respectively. For example, the display area DA and the non-display area NDA of the display panel DP may be substantially the same as the display area DD-DA and the non-display area DD-NDA of the display device DD, respectively. Alternatively, the display area DA and the non-display area NDA of the display panel DP may be different from the display area DD-DA and the non-display area DD-NDA of the display device DD, and may be changed according to the structure or design of the panel DP.

The display panel DP may include a driving circuit, a plurality of signal lines SGL, and a plurality of pixels PX. The plurality of pixels PX is disposed in the display area DA. Each of the pixels PX may include an organic light emitting diode and a pixel driving circuit connected thereto. The driving circuit, the plurality of signal lines SGL, and the pixel driving circuit may be included in the circuit element layer DP-CL shown in FIG. 2.

The driving circuit may include a scan driving circuit GDC. The scan driving circuit GDC may generate a plurality of scan signals and sequentially output the plurality of scan signals to a plurality of scan lines GL, which will be described later. The scan driving circuit GDC may further output another control signal to the driving circuit of the pixels PX.

The scan driving circuit GDC may include a plurality of thin film transistors formed through the same process as that forming the driving circuit of the pixels PX, for example, a low temperature polycrystalline silicon (LTPS) process or a low temperature polycrystalline oxide (LTPO) process.

The plurality of signal lines SGL may include scan lines GL, data lines DL, a power line PL, and a control signal line CSL. The scan lines GL are respectively connected to corresponding pixels PX of the plurality of pixels PX, and the data lines DL are respectively connected to corresponding pixels PX of the plurality of pixels PX. The power line PL is connected to the plurality of pixels PX. The control signal line CSL may provide control signals to the scan driving circuit GDC.

The display panel DP may include signal pads DP-PD connected to ends of the signal lines SGL. The signal pads DP-PD may be a kind of circuit element. An area in which the signal pads DP-PD are disposed in the non-display area NDA is defined as a pad area NDA-PD. For example, touch pads TS-PD connected to touch signal lines, which will be described later, may also be disposed in the pad area NDA-PD.

According to an exemplary embodiment, the display panel DP may include at least one dam structure such as first-dam portion DMP1. For example, the display panel DP may include two first-dam portions, e.g., a first first-dam portion DMP1-1 and a second first-dam portion DMP1-2. The first first-dam portion DMP1-1 may extend along the edge of the display area DA. The first first-dam portion DMP1-1 may surround the display area DA. The second first-dam portion DMP1-2 may extend along an edge of the first first-dam portion DMP1-1. The second first-dam portion DMP1-2 may surround the first first-dam portion DMP1-1. A portion of the first-dam portion DMP1 may be disposed in parallel with the pad area NDA-PD.

In addition, the display panel DP may include at least one second-dam portion DMP2. For example, the display panel DP may include two second-dam portions, e.g., a first second-dam portion DMP2-1 and a second second-dam portion DMP2-2. According to an exemplary embodiment, the second-dam portion DMP2 may overlap the first-dam portion DMP1 in the thickness direction DR3. A first second-dam portion DMP2-1 may be disposed on the first first-dam portion DMP1-1 and may extend along the edge of the display area DA. The first second-dam portion DMP2-1 may surround the display area DA. A second second-dam portion DMP2-2 may overlap the second first-dam portion DMP1-2, and may extend along an edge of the first second-dam portion DMP2-1. A portion of the second-dam portion DMP2 may be disposed in parallel with the pad area NDA-PD.

In FIG. 4, the pixel PX may be connected any one scan line GL, any one data line DL, and the power line PL. The configuration of the pixel PX is not limited thereto and may be modified to have various structures.

An organic light emitting diode OLED may be a front surface light emitting diode or aback surface light emitting diode. The pixel PX may include a first transistor T1 (e.g., a switching transistor), a second transistor T2 (e.g., a driving transistor), and a capacitor Cst as elements of a pixel driving circuit for driving the organic light emitting diode OLED. A first power voltage ELVDD is provided to the second transistor T2, and a second power voltage ELVSS is provided to the organic light emitting diode OLED. The second power voltage ELVSS may be a voltage lower than the first power voltage ELVDD.

The first transistor T1 may output a data signal applied to the data line DL to the capacitor Cst in response to a scan signal applied to the scan line GL. The capacitor Cst may charge a voltage corresponding to the data signal received from the first transistor T1.

The second transistor T2 is connected to the organic light emitting diode OLED. The second transistor T2 may control a driving current flowing through the organic light emitting diode OLED in correspondence with an amount of charge stored in the capacitor Cst. The organic light emitting diode OLED may emit light during a turn-on period of the second transistor T2.

FIG. 5 is a partial cross-sectional view of the display panel DP corresponding to the equivalent circuit shown in FIG. 4. The circuit element layer DP-CL, the display element layer DP-OLED, and the thin film encapsulation layer TFE are sequentially disposed on the base layer SUB.

The circuit element layer DP-CL may include at least one inorganic film, at least one organic film, and a circuit element. The circuit element layer DP-CL includes a buffer film BFL having an inorganic film, a first intermediate inorganic film 10, and a second intermediate inorganic film 20, and may include an intermediate organic film 30 having an organic film.

The inorganic films may include silicon nitride, silicon oxy nitride, silicon oxide, and the like. The organic film may include at least one of acrylic-based resin, methacrylic-based resin, polyisoprene, vinyl-based resin, epoxy-based resin, urethane-based resin, cellulose-based resin, siloxane-based resin, polyimide-based resin, polyamide-based resin, and perylene-based resin. The circuit element may include conductive patterns and/or semiconductor patterns.

The buffer film BFL improves bonding force between the base layer SUB and the conductive patterns or the semiconductor patterns. For example, a barrier layer for blocking a foreign substance from entering the interior of the device may be further disposed on the upper surface of the base layer SUB. The buffer film BFL and the barrier layer may be selectively disposed or omitted.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 are disposed on the buffer film BFL. The first semiconductor pattern OSP1 and the second semiconductor pattern OSP2 may be formed of at least one of amorphous silicon, polysilicon, and a metal oxide semiconductor.

The first intermediate inorganic film 10 is disposed on the first semiconductor pattern OSP1 and the second semiconductor pattern OSP2. A control electrode GE1 (hereinafter, referred to as a first control electrode) of the first transistor T1 and a control electrode GE2 (hereinafter, referred to as a second control electrode) of the second transistor T2 are disposed on the first intermediate inorganic film 10. The first control electrode GE1 and the second control electrode GE2 may be formed through the same photolithography process as that forming the scan lines GL (refer to FIG. 3).

The second intermediate inorganic film 20 covering the first control electrode GE1 and the second control electrode GE2 is disposed on the first intermediate inorganic film 10. An input electrode DE1 (hereinafter, referred to as a first input electrode) and an output electrode SE1 (hereinafter, referred to as a first output electrode) of the first transistor T1, and an input electrode DE2 (hereinafter, referred to as a second input electrode) and an output electrode SE2 (hereinafter, referred to as a second output electrode) of the second transistor T2 are disposed on the second intermediate inorganic film 20.

The first input electrode DE1 and the first output electrode SE1 are connected to the first semiconductor pattern OSP1 through a first through hole CH1 and a second through hole CH2 passing through the first intermediate inorganic film 10 and the second intermediate inorganic film 20, respectively. The second input electrode DE2 and the second output electrode SE2 are connected to the second semiconductor pattern OSP2 through a third through hole CH3 and a fourth through hole CH4 passing through the first intermediate inorganic film 10 and the second intermediate inorganic film 20, respectively. In another exemplary embodiment, some of the first transistor T1 and the second transistor T2 may be modified to have a bottom gate structure.

The intermediate organic film 30 covering the first input electrode DE1, the second input electrode DE2, the first output electrode SE1, and the second output electrode SE2 is disposed on the second intermediate inorganic film 20. The intermediate organic film 30 may have a flat surface.

The intermediate organic film 30 may include a single layer or a plurality of layers. For example, the intermediate organic film 30 may include first intermediate organic film 31 covering the first input electrode DE1, the second input electrode DE2, the first output electrode SE1, and the second output electrode SE2 on the second intermediate inorganic film 20, and a second intermediate organic film 32 disposed on the first intermediate organic film 31. When the intermediate organic film 30 is formed of a plurality of layers, a planarization characteristic of the intermediate organic film 30 may be improved.

The display element layer DP-OLED is disposed on the second intermediate organic film 32. The display element layer DP-OLED may include a pixel definition film PDL and the organic light emitting diode OLED. The pixel definition film PDL may include an organic material as included in the intermediate organic film 30. A first electrode AE is disposed on the second intermediate organic film 32. The first electrode AE is connected to the second output electrode SE2 through a fifth through hole CH5 passing through the intermediate organic film 30. An opening OP is defined in the pixel definition film PDL. The opening OP of the pixel definition film PDL exposes at least a portion of the first electrode AE.

In addition, the pixel definition film PDL may include a light absorbing material. Further, the pixel definition film PDL may be coated with a light absorbing agent to absorb light introduced from the outside. For example, the pixel definition film PDL may include a carbon-based black pigment. However, exemplary embodiments are not limited thereto, and the pixel definition film PDL may include an opaque metal material such as chromium (Cr), molybdenum (Mo), an alloy of molybdenum and titanium (MoTi), tungsten (W), vanadium (V), niobium (Nb), tantalum (Ta), manganese (Mn), cobalt (Co), or nickel (Ni) having high light absorption.

The pixel PX may be disposed in a pixel area. The pixel area may include an emission area PXA and a non-emission area NPXA adjacent to the emission area PXA. The non-emission area NPXA may surround the emission area PXA. In an exemplary embodiment, the emission area PXA is defined to correspond to a partial area of the first electrode AE exposed by the opening OP.

A hole control layer HCL may be commonly disposed in the emission area PXA and the non-emission area NPXA. For example, a common layer (e.g., the hole control layer HCL) may be commonly formed in the plurality of pixels PX (refer to FIG. 3).

An emission layer EML is disposed on the hole control layer HCL. The emission layer EML may be disposed in an area corresponding to the opening OP. For example, the emission layer EML may be formed separately in the plurality of respective pixels PX. The emission layer EML may include an organic material and/or an inorganic material to emit a predetermined color. For example, the pixel PX may include first to third sub pixels. Each of the first to third sub pixels may emit red light, green light, or blue light.

However, exemplary embodiments are not limited thereto. For example, the emission layer EML may be commonly disposed in the plurality of pixels PX. In this case, the emission layer EML may emit white light.

An electronic control layer ECL is disposed on the emission layer EML. For example, the electronic control layer ECL may be commonly formed in the plurality of pixels PX (refer to FIG. 3).

A second electrode CE is disposed on the electronic control layer ECL. The second electrode CE is commonly disposed in the plurality of pixels PX.

Figure 8A:
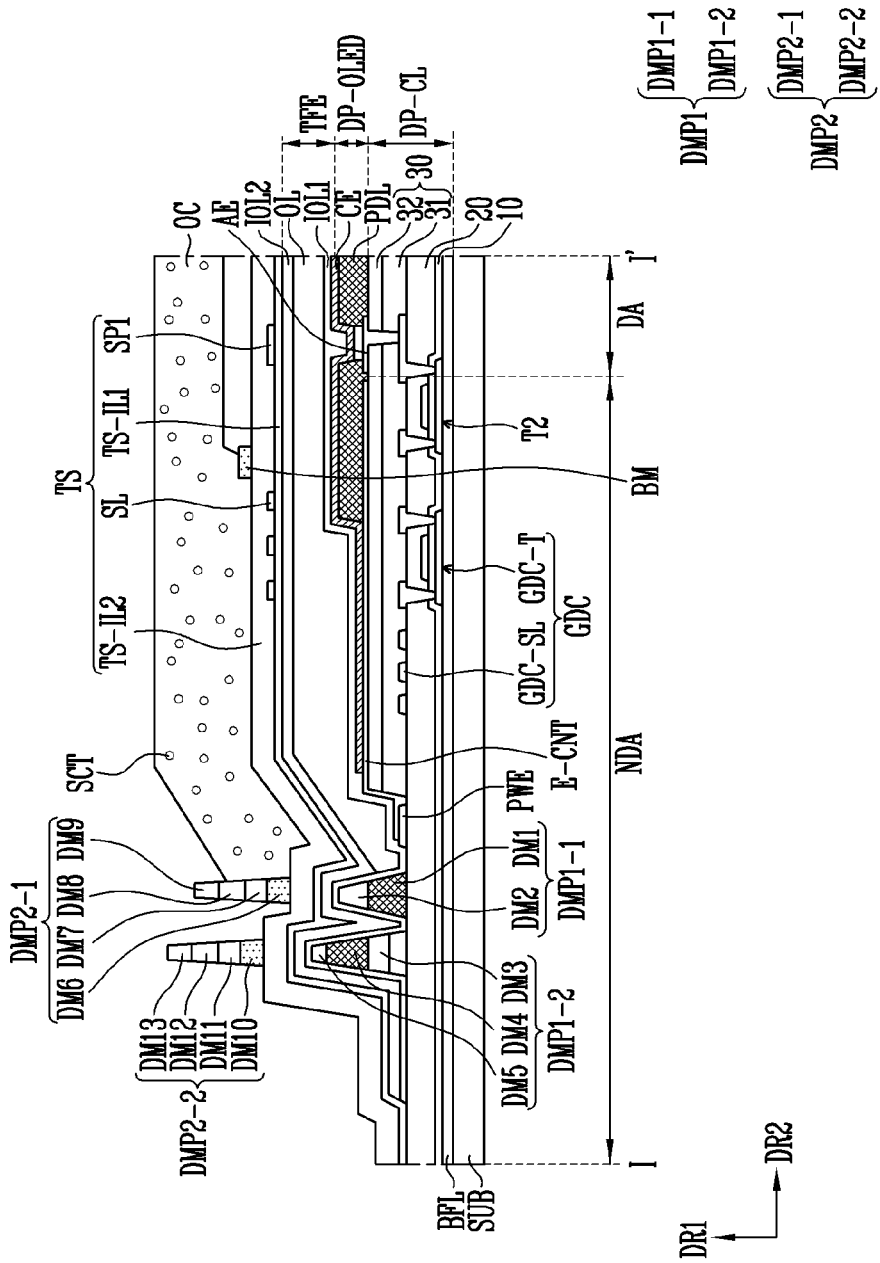
FIG. 8A is a cross section view taken along line I-I' of FIG. 6B.
Figure 8B:
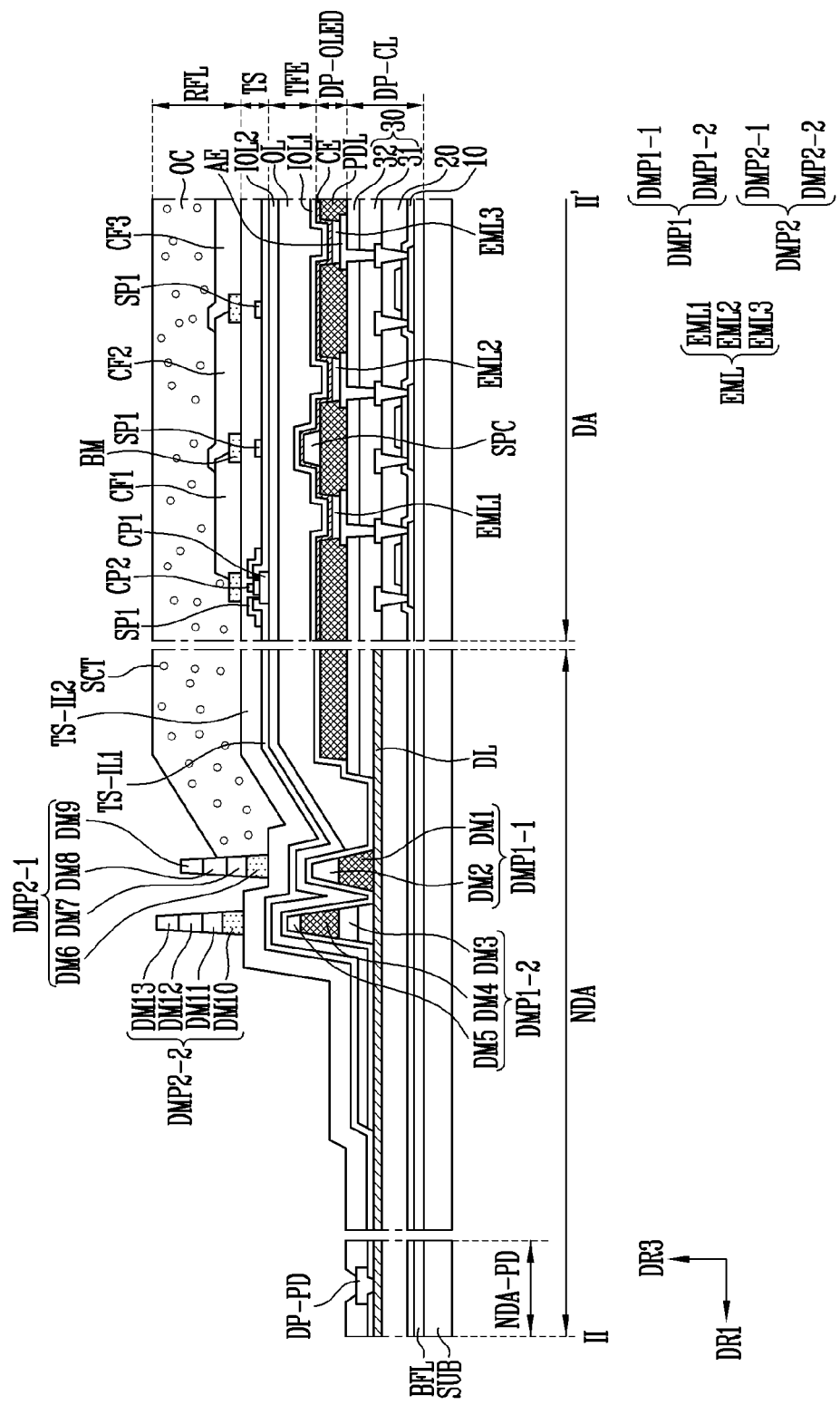
FIG. 8B is a cross section view taken along line II-II' of FIG. 6B.

As shown in FIG. 8B, when a separate spacer SPC is further disposed on the pixel definition film PDL, the second electrode CE may be disposed on the spacer SPC.

The thin film encapsulation layer TFE is disposed on the second electrode CE. The thin film encapsulation layer TFE is commonly disposed in the plurality of pixels PX. In the illustrated exemplary embodiment, the thin film encapsulation layer TFE may be disposed directly on the second electrode CE. In an exemplary embodiment, a capping layer covering the second electrode CE may be further disposed between the thin film encapsulation layer TFE and the second electrode CE. In this case, the thin film encapsulation layer TFE may be disposed directly on the capping layer.

Figure 6A:
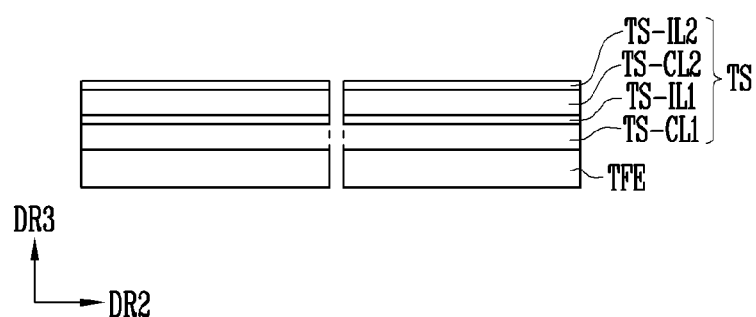
FIG. 6A is a cross-sectional view of an exemplary embodiment of a touch sensing unit of FIG. 2.
Figure 6B:
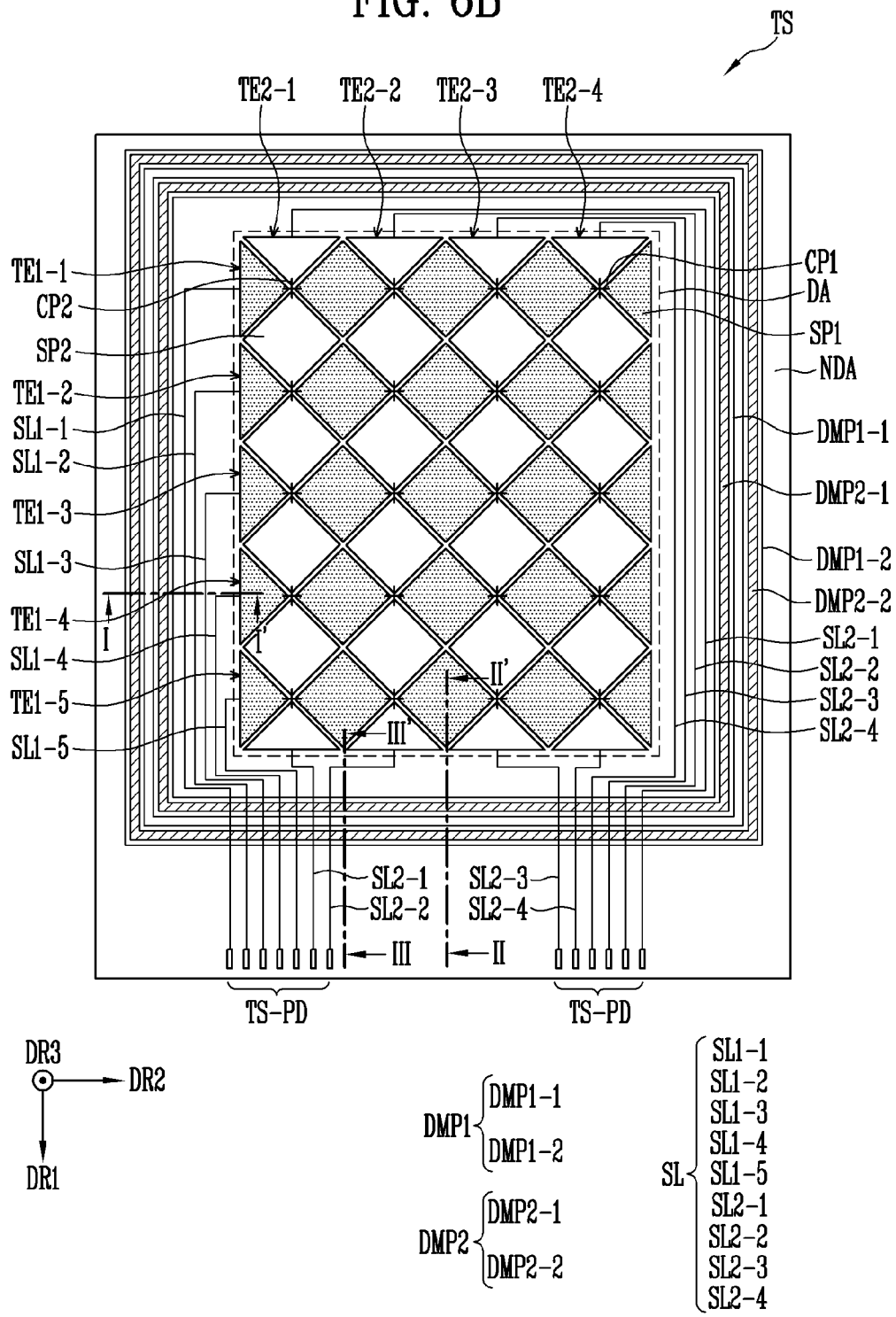
FIG. 6B is a plan view of the touch sensing unit of FIG. 6A.
Figure 7A:
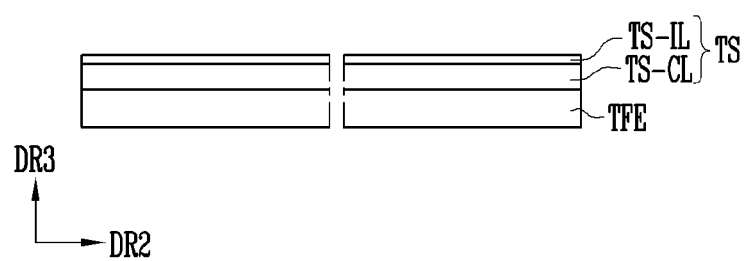
FIG. 7A is a cross-sectional view of another exemplary embodiment of the touch sensing unit of FIG. 2.
Figure 7B:
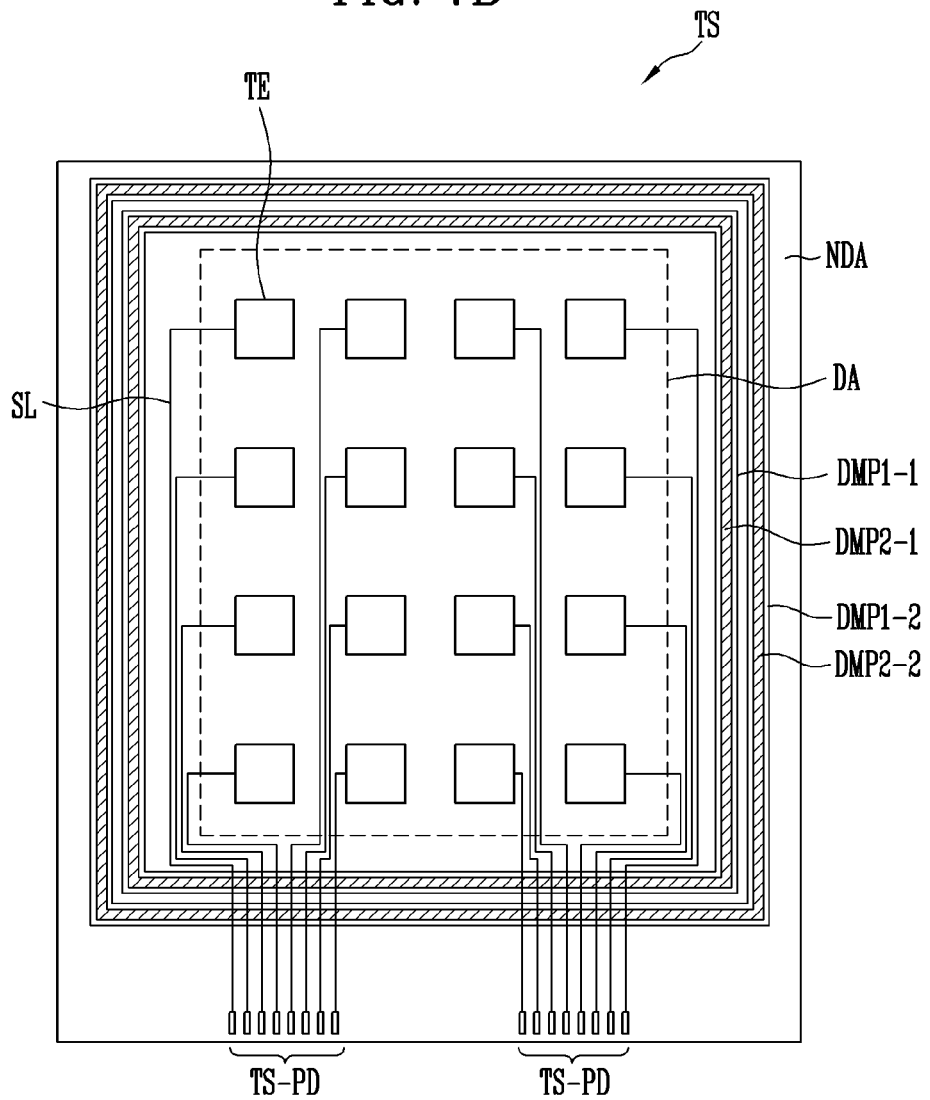
FIG. 7B is a plan view of the touch sensing unit of FIG. 7A.
Figure 7B:
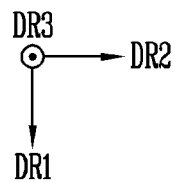
Figure 7B:
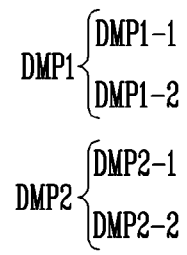

FIG. 6A is a cross-sectional view of an exemplary embodiment of a touch sensing unit TS of FIG. 2. FIG. 6B is a plan view of the touch sensing unit TS of FIG. 6A. FIG. 7A is a cross-sectional view of another exemplary embodiment of the touch sensing unit TS of FIG. 2. FIG. 7B is a plan view of the touch sensing unit TS of FIG. 7A.

As shown in FIG. 6A, the touch sensing unit TS may include a first conductive layer TS-CL1, a first insulating layer TS-IL1 (hereinafter, referred to as a first touch insulating layer), a second conductive layer TS-CL2, and a second insulating layer TS-IL2 (hereinafter, referred to as a second touch insulating layer). The first conductive layer TS-CL1 is disposed directly on the thin film encapsulation layer TFE. Exemplary embodiments are not limited thereto, and another inorganic layer or organic layer may be further disposed between the first conductive layer TS-CL1 and the thin film encapsulation layer TFE.

Each of the first conductive layer TS-CL1 and the second conductive layer TS-CL2 may have a single layer structure or a multilayer structure stacked along the third direction DR3. The conductive layer of the multiplayer structure may include at least two of transparent conductive layers and metal layers. The conductive layer of the multilayer structure may include metal layers including different metals. The transparent conductive layer may include indium tin oxide (ITO), indium zinc oxide (IZO), zinc oxide (ZnO), indium tin zinc oxide (ITZO), PEDOT, a metal nanowire, and graphene. The metal layer may include molybdenum, silver, titanium, copper, aluminum, and an alloy thereof. For example, each of the first conductive layer TS-CL1 and the second conductive layer TS-CL2 may have a three-layer structure of titanium/aluminum/titanium.

Each of the first conductive layer TS-CL1 and the second conductive layer TS-CL2 may include a plurality of patterns. Hereinafter, the first conductive layer TS-CL1 includes first conductive patterns, and the second conductive layer TS-CL2 includes second conductive patterns. Each of the first conductive patterns and the second conductive patterns may include touch electrodes and touch signal lines.

Each of the first touch insulating layer TS-IL1 and the second touch insulating layer TS-IL2 may include an inorganic material or an organic material. At least one of the first touch insulating layer TS-IL1 and the second touch insulating layer TS-IL2 may include an inorganic film. The inorganic film may include at least one of aluminum oxide, titanium oxide, silicon oxide silicon oxynitride, zirconium oxide, and hafnium oxide.

At least one of the first touch insulating layer TS-IL1 and the second touch insulating layer TS-IL2 may include an organic film. The organic film may include at least one of acrylic-based resin, methacryl-based resin, polyisoprene, vinyl-based resin, epoxy-based resin, urethane-based resin, cellulose-based resin, siloxane-based resin, polyimide-based resin, polyamide-based resin, and perylene-based resin. In the illustrated exemplary embodiment, the first touch insulating layer TS-IL1 is described as a touch inorganic film, and the second touch insulating layer TS-IL2 is described as a touch organic film for descriptive convenience.

As shown in FIG. 6B, the touch sensing unit TS may include first touch electrodes TE1-1 to TE1-5, first touch signal lines SL1-1 to SL1-5 connected to the first touch electrodes TE1-1 to TE1-5, second touch electrodes TE2-1 to TE2-4, second touch signal lines SL2-1 to SL2-4 connected to the second touch electrodes TE2-1 to TE2-4, and touch pads TS-PD connected to the first touch signal lines SL1-1 to SL1-5 and the second touch signal lines SL2-1 to SL2-4. The first touch signal lines SL1-1 to SL1-5 are connected to one ends of the first touch electrodes TE1-1 to TE1-5, respectively. The second touch signal lines SL2-1 to SL2-4 are connected to both ends of the second touch electrodes TE2-1 to TE2-4, respectively. In an exemplary embodiment, the first touch signal lines SL1-1 to SL1-5 are also connected to both ends of the first touch electrodes TE1-1 to TE1-5, or the second touch signal lines SL2-1 to SL2-4 may be connected to one ends of the second touch electrodes TE2-1 to TE2-4, respectively.

FIG. 6B additionally shows a first-dam portion DMP1 provided in the display panel DP to illustrate its relative position with respect to the touch sensing unit TS. Each of the first touch electrodes TE1-1 to TE1-5 may have a mesh shape in which a plurality of touch openings is defined. Each of the first touch electrodes TE1-1 to TE1-5 may include a plurality of first touch sensor portions SP1 and a plurality of first connection portions CP1. The first touch sensor portions SP1 are arranged along the second direction DR2. Each of the first connection portions CP1 may connect two adjacent first touch sensor portions SP. For example, the first touch signal lines SL1-1 to SL1-5 may also have a mesh shape.

The second touch electrodes TE2-1 to TE2-4 may be insulated from and intersect the first touch electrodes TE1-1 to TE1-5. Each of the second touch electrodes TE2-1 to TE2-4 may have a mesh shape in which a plurality of touch openings is defined. Each of the second touch electrodes TE2-1 to TE2-4 may include a plurality of second touch sensor portions SP2 and a plurality of second connection portions CP2. The second touch sensor portions SP2 are arranged along the first direction DR1. Each of the second connection portions CP2 may connect two adjacent second touch sensor portions SP2. The second touch signal lines SL2-1 to SL2-4 may also have a mesh shape.

The first touch electrodes TE1-1 to TE1-5 and the second touch electrodes TE2-1 to TE2-4 are electrostatically coupled. For example, the first touch electrodes TE1-1 to TE1-5 and the second touch electrodes TE2-1 to TE2-4 may be operated together by electrostatic coupling therebetween. For example, when an object approaches the touch sensing unit TS, the capacitance between the first touch sensor portions SP1 and the second touch sensor portions SP2 is changed. Further, when touch sensing signals are applied to the first touch electrodes TE1-1 to TE1-5, the variation of a capacitance between the first touch sensor portions SP1 and the second touch sensor portions SP2 is detected.

Some of the plurality of first touch sensor portions SP1, the plurality of first connection portions CP1, the first touch signal lines SL1-1 to SL1-5, the plurality of second touch sensor portions SP2, the plurality of second connection portions CP2, and the plurality of second touch signal lines SL2-1 to SL2-4 may be formed by patterning the first conductive layer TS-CL1 shown in FIG. 6A. Others of the plurality of first touch sensor portions SP1, the plurality of first connection portions CP1, the first touch signal lines SL1-1 to SL1-5, the plurality of second touch sensor portions SP2, the plurality of second connection portions CP2, and the plurality of second touch signal lines SL2-1 to SL2-4 may be formed by patterning the second conductive layer TS-CL2 shown in FIG. 6A. For example, the plurality of first connection portions CP1 may be formed by patterning the first conductive layer TS-CL1. For example, the plurality of first touch sensor portions SP1, the first touch signal lines SL1-1 to SL1-5, the plurality of second touch sensor portions SP2, the plurality of second connection portions CP2, and the second touch signal lines SL2-1 to SL2-4 may be formed by patterning the second conductive layer TS-CL2. However, exemplary embodiments are not limited thereto.

Although the touch sensing unit TS in which the plurality of first connection portions CP1 and the plurality of second connection portions CP2 cross each other is illustrated, exemplary embodiments are not limited thereto. For example, each of the second connection portions CP2 may be deformed in a V shape so as not to overlap the plurality of first connection portions CP. The second connection portions CP2 of the V shape may overlap the first touch sensor portions SP1. In the illustrated exemplary embodiment, the first touch sensor portions SP1 and the second touch sensor portions SP2 having a generally rhomboid or triangular shape are illustrated, but exemplary embodiments are not limited thereto.

As shown in FIG. 7A, the touch sensing unit TS may be a single layer type touch sensing unit including the conductive layer TS-CL and the insulating layer TS-IL (a touch insulating layer). The single layer type touch sensing unit may obtain coordinate information by a self-cap method.

The conductive layer TS-CL may have a single layer structure or a multilayer structure stacked along the third direction DR3. The conductive layer of the multiplayer structure may include at least two of transparent conductive layers and metal layers. The conductive layer TS-CL may include a plurality of patterns such as a touch electrode and touch signal lines. The touch insulating layer TS-IL may include at least an inorganic film. The touch insulating layer may further include an organic film.

As shown in FIG. 7B, the touch sensing unit TS may include touch electrodes TE and touch signal lines SL spaced apart from each other. The touch electrodes TE may be arranged in a matrix form and are respectively connected to the touch signal lines SL. The shape and arrangement of the touch electrodes TE are not particularly limited. Some of the touch signal lines SL may be disposed in the display area DA, and some of the touch signal lines SL may be disposed in the non-display area NDA.

Figure 8C:
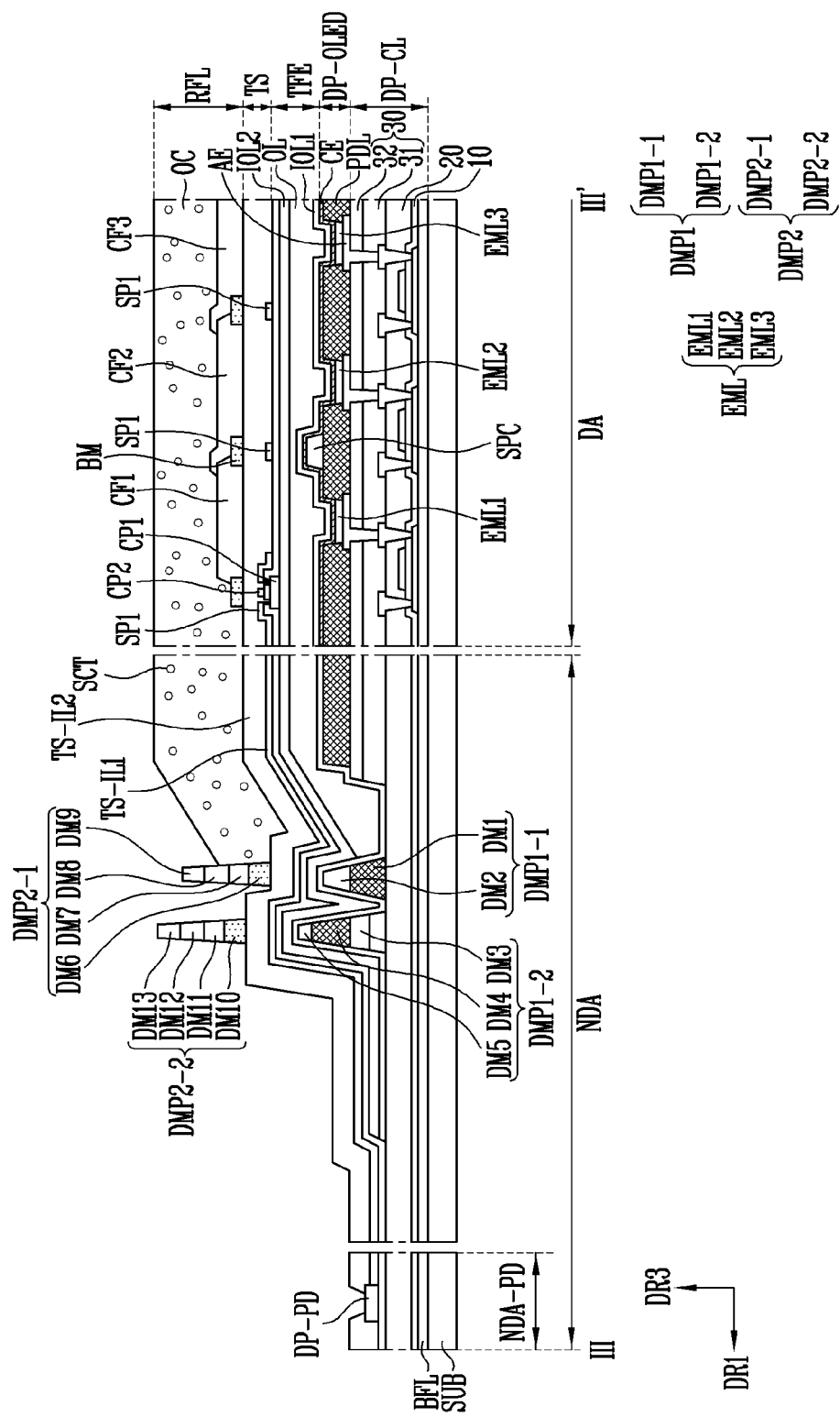
FIG. 8C is a cross section view taken along line III-III' of FIG. 6B.

FIG. 8A is a cross section view taken along line I-I' of FIG. 6B. FIG. 8B is a cross section view taken along line II-II' of FIG. 6B. FIG. 8C is a cross section view taken along line III-III' of FIG. 6B. FIG. 8B shows a cross section overlapping the data line DL, and FIG. 8C shows a cross section overlapping the touch signal line SL.

The stacked structure of the circuit element layer DP-CL, the display element layer DP-OLED, and the thin film encapsulation layer TFE disposed in the display area DA is the same as the structure described with reference to FIG. 5, and thus detailed description thereof will be omitted to avoid redundancy. However, the hole control layer HCL and the electronic control layer ECL are not shown in FIGS. 8A and 8B. The stack structure of the touch sensing unit TS is also the same as the structure described with reference to FIGS. 6A and 6B, and thus detailed description thereof will be omitted to avoid redundancy. The thin film encapsulation layer TFE including a first encapsulation inorganic film IOL1, a second encapsulation inorganic film IOL2, and an encapsulation organic film OL disposed between the first encapsulation inorganic film IOL1 and the second encapsulation inorganic film IOL2 is illustrated.

As shown in FIGS. 8A and 8B, the scan driving circuit GDC configuring the circuit element layer DP-CL is disposed in the non-display area NDA. The scan driving circuit GDC may include at least one transistor GDC-T formed through the same process as the second transistor T2. The scan driving circuit GDC may include signal lines GDC-SL disposed on the same layer as the input electrode of the second transistor T2. For example, the scan driving circuit GDC may further include a signal line disposed on the same layer as the control electrode of the second transistor T2.

A power electrode PWE providing the second power voltage ELVSS is disposed outside the scan driving circuit GDC. The power electrode PWE may receive the second power voltage from an external device. A connection electrode E-CNT is disposed on the intermediate organic film 30. The connection electrode E-CNT may connect the power electrode PWE and the second electrode CE to each other. Since the connection electrode E-CNT is formed through the same process as the first electrode AE, the connection electrode E-CNT may have the same layer structure and the same material as the first electrode AE. The connection electrode E-CNT and the first electrode AE may have substantially the same thickness.

One data line DL disposed on the second intermediate inorganic film 20 is illustrated, e.g., in FIG. 8B. A signal pad DP-PD is connected to an end of the data line DL.

As shown in FIGS. 8A to 8C, the display panel DP may include at least one first-dam portion DMP1. For example, the display panel DP may include two first-dam portions DMP1-1 and DMP1-2. The first first-dam portion DMP1-1 may have a multilayer structure. A lower portion DM1 may be formed simultaneously with the pixel definition film PDL. An upper portion DM2 may be formed simultaneously with the spacer SPC. In addition, the second first-dam portion DMP1-2 may have a multilayer structure. A lower portion DM3 may be formed simultaneously with the intermediate organic film 30. A middle portion DM4 may be formed simultaneously with the pixel definition film PDL. An upper portion DM5 may be simultaneously formed with the spacer SPC. The second first-dam portion DMP1-2 may have a height greater than the first first-dam portion DMP1-1 by the thickness of the intermediate organic film 30. For example, the top surface of the second first-dam portion DMP1-2 may be at a higher level than the top surface of the first first-dam portion DMP1-1.

The first-dam portion DMP1 may prevent liquid organic material from being spread or leaked to the outside in the process of forming the encapsulation organic film OL. The encapsulation organic film OL may form the liquid organic material on the first encapsulation inorganic film IOL1 by an inkjet method. In this case, the first-dam portion DMP1 may set or define a boundary of an area where the liquid organic material is disposed.

The first encapsulation inorganic film IOL1 and the second encapsulation inorganic film IOL2 may overlap the top of first-dam portion DMP1. The first encapsulation inorganic film IOL1 may contact the second intermediate inorganic film 20. In FIG. 8B, a portion of the data line DL is disposed between the second intermediate inorganic film 20 and the first encapsulation inorganic film IOL1. However, as shown in FIG. 8C, the first encapsulation inorganic film IOL1 and the second intermediate inorganic film 20 may contact each other in an area where the data line DL is not disposed.

The touch inorganic films TS-IL1 and TS-IL2 may overlap the first-dam portion DMP1, as shown in FIG. 8A. The touch inorganic film TS-IL1 may contact the first encapsulation inorganic film IOL1, the second encapsulation inorganic film IOL2, the first-dam portion DMP1, and the second intermediate inorganic film 20. In FIG. 8B, the data line DL is disposed between the touch inorganic film TS-IL1 and the second intermediate inorganic film 20. However, as shown in FIG. 8C, the touch inorganic film TS-IL1 and the second intermediate inorganic film 20 may contact each other in another area where the data line DL is not disposed.

The anti-reflection layer RFL may be disposed on the touch sensing unit TS, as shown in FIG. 8B. Since the anti-reflection layer RFL may block external light reflection, a separate polarizer can be omitted in favor of the anti-reflection layer RFL. Therefore, the thickness of the display panel DP may be minimized while preventing a reduction in luminance of the display device DD as described above.

The anti-reflection layer RFL may include a light blocking layer BM and color filters CF1, CF2, and CF3.

The light blocking layer BM may be disposed on the second insulating layer TS-IL2.

The light blocking layer BM may include a light absorbing material. For example, the light blocking layer BM may be coated with a light absorbing agent to absorb light introduced from the outside. In this case, the light blocking layer BM may include a carbon-based black pigment. However, exemplary embodiments are not limited thereto, and the light shielding layer BM may include an opaque metal material such as chromium (Cr), molybdenum (Mo), an alloy of molybdenum and titanium (MoTi), tungsten (W), vanadium (V), niobium (Nb), tantalum (Ta), manganese (Mn), cobalt (Co), or nickel (Ni) having high light absorption.

The light blocking layer BM may overlap the pixel definition film PDL in the thickness direction, i.e., in the third direction DR3.

According to an exemplary embodiment, the width of the light blocking layer BM in one direction may be different from the width of the pixel definition film PDL in the one direction. In addition, the width of the light blocking layer BM in the one direction may be different from the width of a second pixel definition film PDL2 in the one direction. For example, the width of the light blocking layer BM in the one direction may be less than the width of the pixel definition film PDL in the one direction. Here, the width of the pixel definition film PDL in the one direction means a gap in the one direction between ends of the pixel definition film PDL disposed between adjacent emission layers EML. The width of the light blocking layer BM in the one direction means a gap in the one direction between ends of the light blocking layer BM disposed between adjacent color filters CF1, CF2, and CF3.

When the width of the light blocking layer BM is less than the width of the pixel definition film PDL, absorption of light emitted from the emission layer EML to the light blocking layer BM may be minimized. Thus, the side luminance ratio may be improved and white angular dependency (WAD) may be enhanced. Here, WAD means an issue that a green (or another color) hue is recognized at an edge of the display device DD according to the viewing angle of an observer.

However, when the width of the light blocking layer BM is extremely small, the external light absorbing function of the light blocking layer BM is reduced, and thus the width of the light blocking layer BM may be adjusted in consideration of the side luminance ratio, WAD, and reflectance.

The color filters CF1, CF2, and CF3 may be disposed on the light blocking layer BM.

One surface of the second insulating layer TS-IL2 exposed by the light blocking layer BM may be defined as an opening. The color filters CF1, CF2, and CF3 may be disposed in the opening defined by the light blocking layer BM. In this case, the color filters CF1, CF2, and CF3 may directly contact the second insulating layer TS-IL2 in the opening. In addition, the color filters CF1, CF2, and CF3 may extend from an edge of the opening to an upper surface of the light blocking layer BM and directly contact the upper surface of the light blocking layer BM.

The color filters CF1, CF2, and CF3 may overlap the emission layer EML of the pixels PX.

For example, a first color filter CF1 may be a green color filter overlapping the emission layer EML1 of a first sub pixel, a second color filter CF2 may be a blue color overlapping the emission layer EML2 of a second sub pixel, and a third color filter CF3 may be a red color filter overlapping the emission layer EML3 of a third sub pixel.

As shown in FIGS. 8B and 8C, since the light blocking layer BM and the color filters CF1, CF2, and CF3 are disposed on the second insulating layer TS-IL2, step differences in height are formed on the light blocking layer BM and the color filters CF1, CF2, and CF3. Thus, the anti-reflection layer RFL may include an overcoat layer OC to planarize the step differences on the light blocking layer BM and the color filters CF1, CF2, and CF3. The overcoat layer OC may be an organic film formed of an organic material such as an acrylic-based resin, an epoxy-based resin, or a polyimide-based resin.

The overcoat layer OC may overlap the entire display area DA in the thickness direction DR3 and may overlap a portion of the non-display area NDA in the thickness direction DR3. For example, the overcoat layer OC may overlap a portion of the first first-dam portion DMP1-1 in the thickness direction DR3. The overcoat layer OC may contact the light blocking layer BM, the color filters CF1, CF2, and CF3, and the second insulating layer TS-IL2. According to an exemplary embodiment, the thickness of the overcoat layer OC may be about 5 to 30 μm. For example, the thickness of the overcoat layer OC means the shortest distance between an upper surface of the second insulating layer TS-IL2 and an upper surface of the overcoat layer OC.

The overcoat layer OC may include a plurality of scatterers SCT such as light scattering elements. The scatterer SCT may scatter light incident on the overcoat layer OC to increase light amount emitted from the overcoat layer OC. For example, the scatterers SCT may scatter light incident on the overcoat layer OC such that the front luminance and the side luminance are substantially uniform. The scatterers SCT may include at least one selected from $TiO_2$, $Al_2O_3$, and $SiO_2$, but exemplary embodiments are not limited thereto.

The display panel DP may include at least one second-dam portion DMP2. For example, the display panel DP may include two second-dam portions DMP2-1 and DMP2-2.

The first second-dam portion DMP2-1 and the second second-dam portion DMP2-2 may be disposed on the non-display area NDA and not on the pad area NDA-PD. For example, the first second-dam portion DMP2-1 may overlap the first first-dam portion DMP1-1 in the thickness direction DR3, and the second second-dam portion DMP2-2 may overlap the second first-dam portion DMP1-2 in the thickness direction DR3.

The second-dam portion DMP2 may have a multilayer structure including at least two layers. For example, as shown in FIGS. 8A to 8C, the second-dam portion DMP2 may be formed of four layers.

The second-dam portion DMP2 may be simultaneously formed during the patterning process of the light blocking layer BM of the anti-reflection layer RFL and the color filters CF1, CF2, and CF3. First layers DM6 and DM10 may be simultaneously formed with the light blocking layer BM. Second layers DM7 and DM11 may be simultaneously formed with the first color filter CF1. Third layers DM8 and DM12 may be simultaneously formed with the second color filter CF2. Fourth layers DM9 and DM13 simultaneously formed with the third color filter CF3.

The second-dam portion DMP2 may prevent the liquid organic material from being spread or leaked to the outside of the first and second intermediate inorganic films 10 and 20 and from covering the pad area NDA-PD in the process of forming the overcoat layer OC. The overcoat layer OC may be implemented by forming the liquid organic material on the second insulating layer TS-IL2 by an inkjet method. In this case, the second-dam portion DMP2 may set or define a boundary of an area where the liquid organic material is disposed.

After forming the second-dam portion DMP2 as the boundary of the area where the liquid organic material is disposed, the overcoat layer OC is formed by the inkjet method. Thus, the number of mask processes for forming the anti-reflection layer RFL is reduced by forming the second-dam portion DMP2.

Hereinafter, other exemplary embodiments will be described. In the following exemplary embodiments, the same configuration as the already described embodiment will be omitted or simplified, and differences will be mainly described to avoid redundancy.

Figure 9:
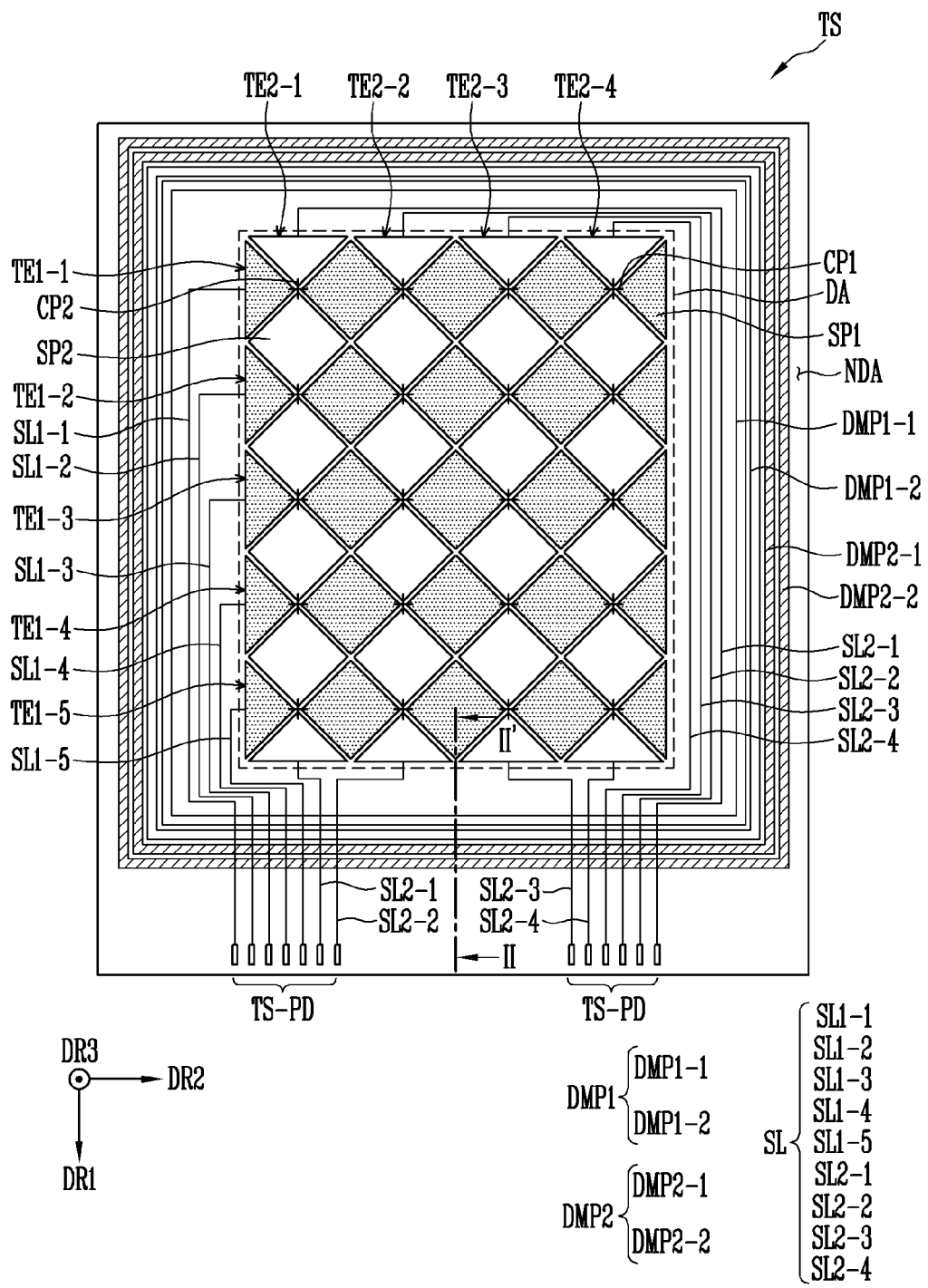
FIG. 9 is a plan view of another exemplary embodiment of the touch sensing unit of FIG. 2.
Figure 10:
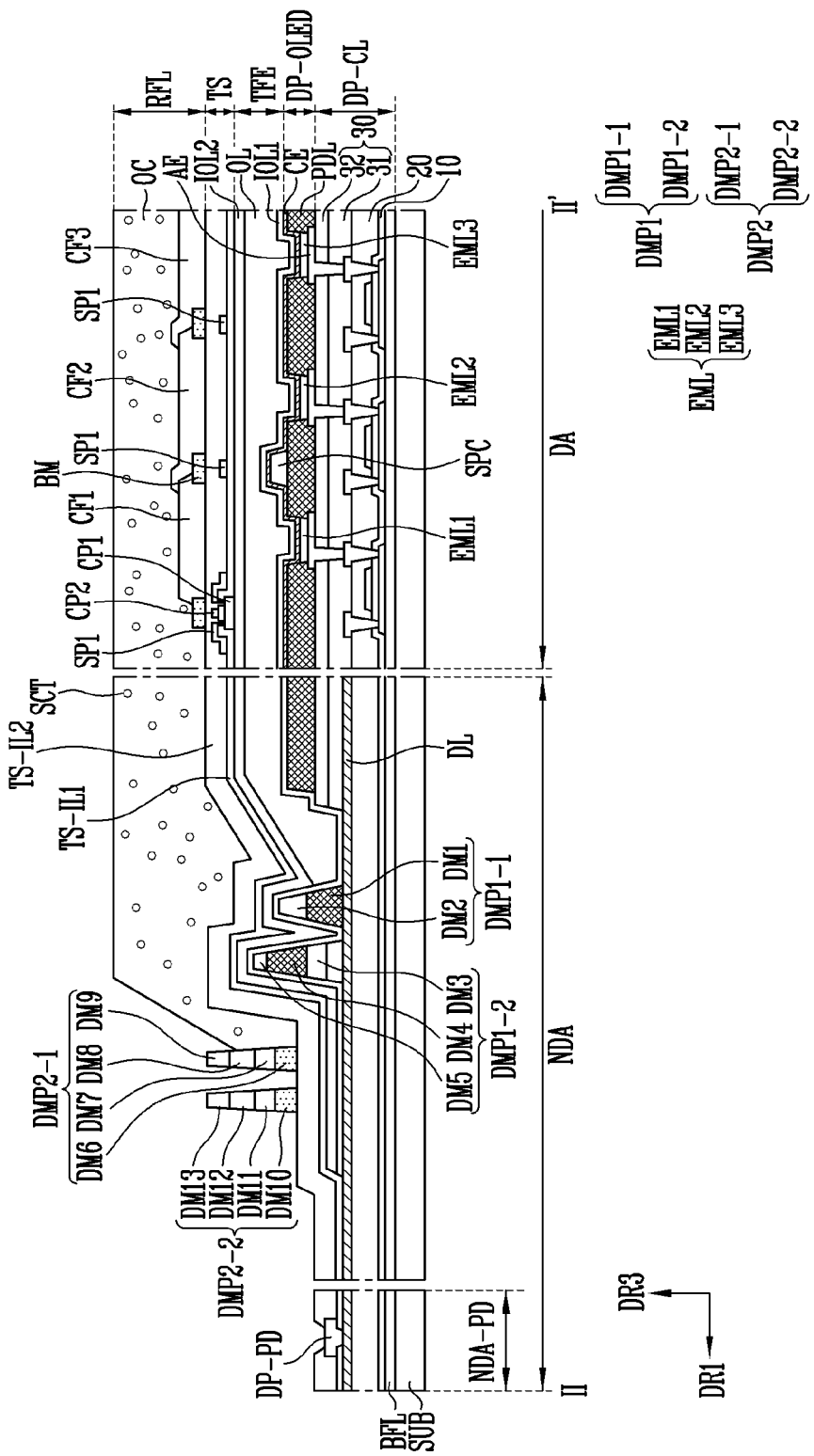
FIG. 10 is a cross-sectional view taken along line II-II' of FIG. 9.

FIG. 9 is a plan view of another exemplary embodiment of the touch sensing unit TS of FIG. 2. FIG. 10 is a cross-sectional view taken along line II-II' of FIG. 9.

FIGS. 9 and 10 differ from the embodiment of FIG. 6B in that the second-dam portion DMP2 is disposed so as not to overlap the first-dam portion DMP1.

Specifically, according to this exemplary embodiment, the display panel DP may include at least one first-dam portion DMP1. For example, the display panel DP may include two first-dam portions DMP1-1 and DMP1-2. The first first-dam portion DMP1-1 may extend along the edge of the display area DA. The first first-dam DMP1-1 may surround the display area DA. The second first-dam portion DMP1-2 may extend along the edge of the first first-dam portion DMP1-1. The second first-dam portion DMP1-2 may surround the first first-dam portion DMP1-1. A portion of the first-dam portion DMP1 may be disposed substantially in parallel with the pad area NDA-PD.

In addition, the display panel DP may include at least one second-dam portion DMP2. For example, the display panel DP may include two second-dam portions DMP2-1 and DMP2-2.

The first second-dam portion DMP2-1 and the second second-dam portion DMP2-2 may be disposed on the non-display area NDA between the first-dam portion DMP1 and the pad area NDA-PD. For example, the second-dam portion DMP2 may be disposed so as not to overlap the first-dam portion DMP1 in the thickness direction DR3. The first second-dam portion DMP2-1 may extend along an edge of the second first-dam portion DMP1-2. The first second-dam portion DMP2-1 may surround the second first-dam portion DMP1-2. The second second-dam portion DMP2-2 may extend along the edge of the first second-dam portion DMP2-1. The second second-dam portion DMP2-2 may surround the first second-dam portion DMP2-1.

The overcoat layer OC may overlap the entire display area DA in the thickness direction DR3 and may overlap a portion of the non-display area NDA in the thickness direction DR3. For example, the overcoat layer OC may overlap the first first-dam portion DMP1-1 and the second first-dam portion DMP1-2 in the thickness direction DR3. The overcoat layer OC may contact the light blocking layer BM, the color filters CF1, CF2, and CF3, and the second insulating layer TS-IL2. According to an exemplary embodiment, the thickness of the overcoat layer OC may be about 5 to 30 µm. For example, the thickness of the overcoat layer OC means the shortest distance between the upper surface of the second insulating layer TS-IL2 and the upper surface of the overcoat layer OC.

Figure 11A:
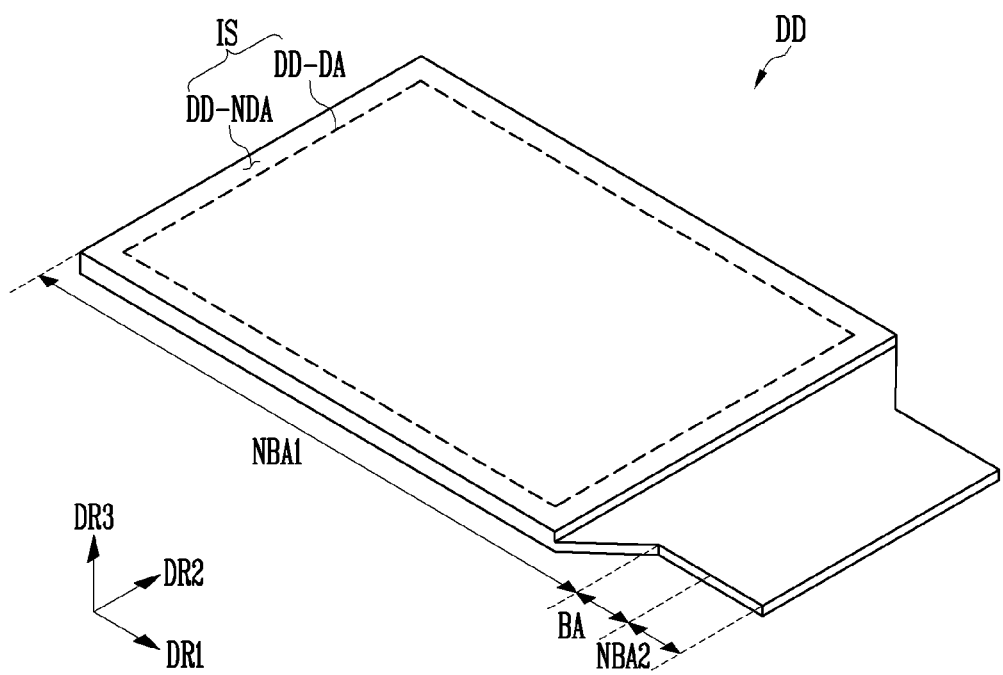
FIGS. 11A and 11B are perspective views of another exemplary embodiment of a display device constructed according to the principles of the invention.
Figure 11B:
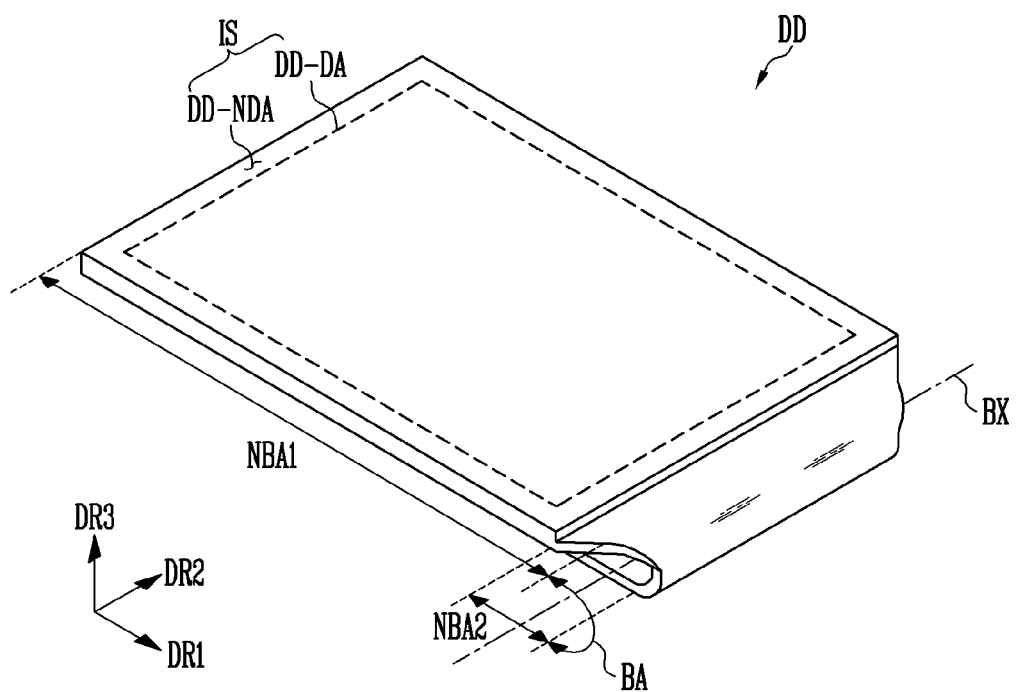
Figure 12:
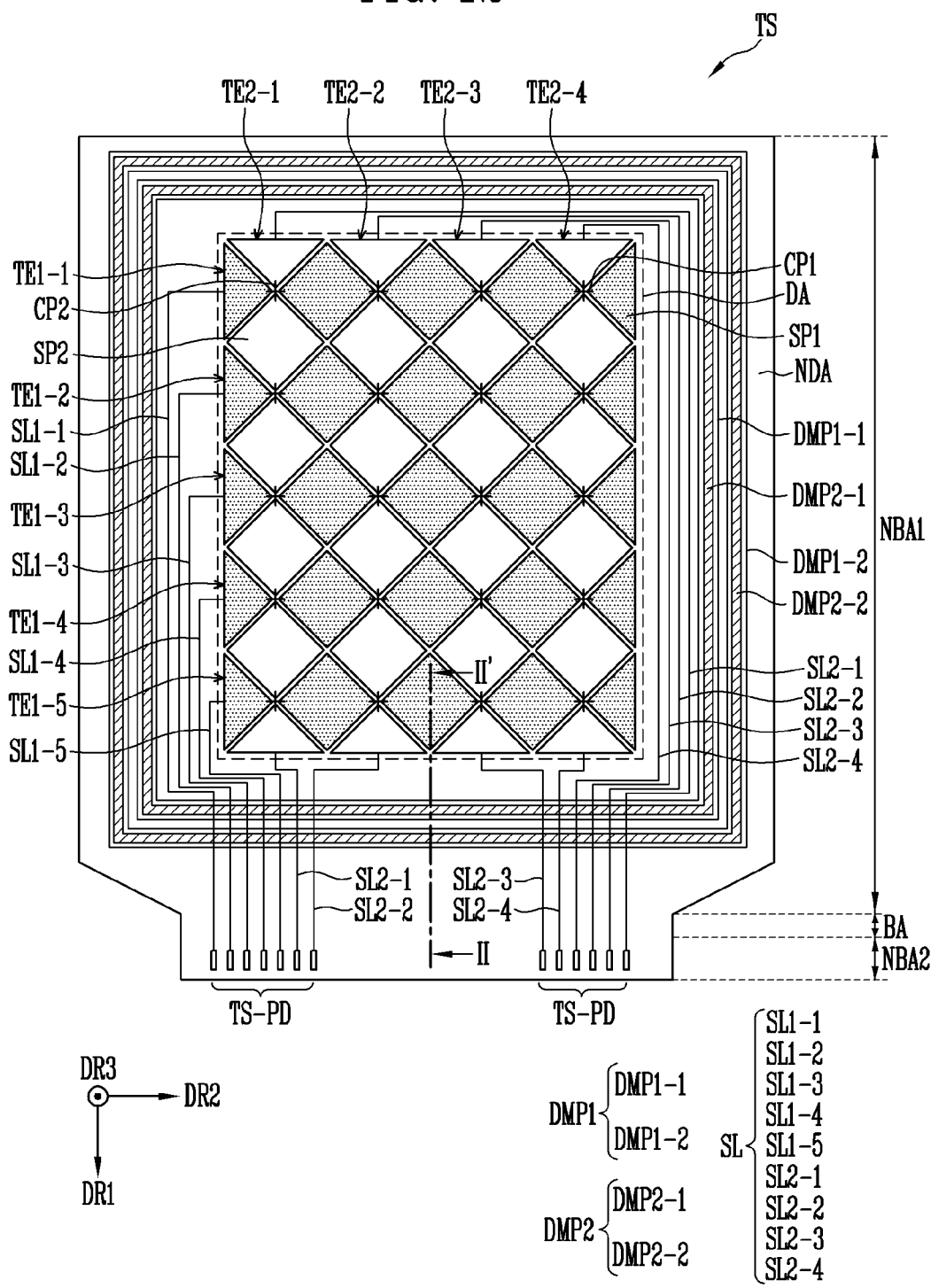
FIG. 12 is a plan view of a touch sensing unit of FIGS. 11A and 11B.
Figure 13:
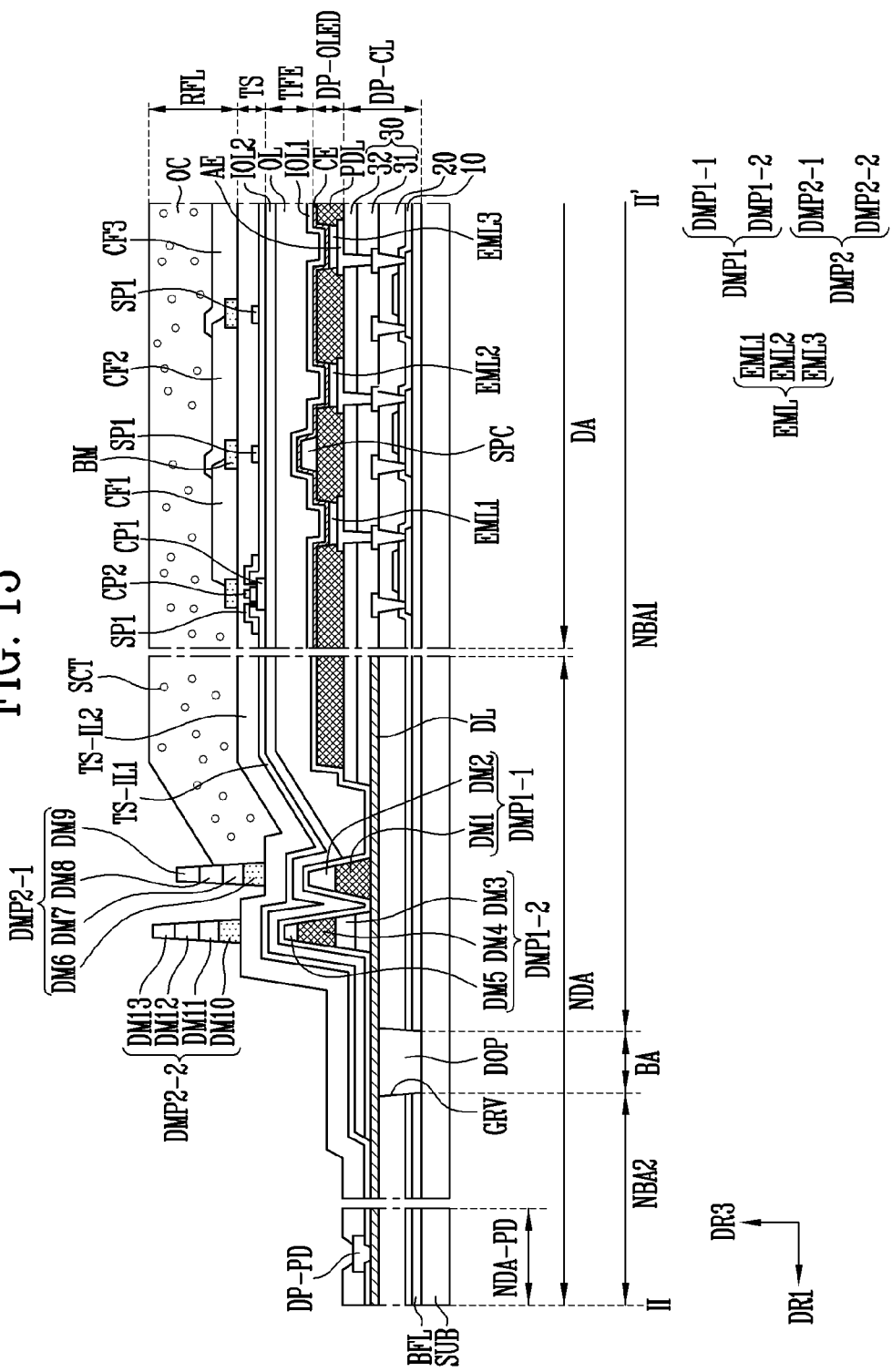
FIG. 13 is a cross-sectional view e taken along line II-II' of FIG. 12.

FIGS. 11A and 11B are perspective views of another exemplary embodiment of a display device constructed according to the principles of the invention. FIG. 12 is a plan view of the touch sensing unit TS of FIGS. 11A and 11B. FIG. 13 is a cross-sectional view taken along line II-II' of FIG. 12.

FIGS. 11A to 13 differ from the embodiment of FIG. 6B in that the embodiment of FIGS. 11A to 13 includes a bendable area.

Specifically, the display device DD may be a substantially flat, rigid display device. In this case, the display device DD may include a rigid substrate. The rigid substrate may be formed of at least one material of glass, quartz, aluminosilicate, borosilicate, boroaluminosilicate.

The display device DD includes a first non-bendable area NBA1, a second non-bendable area NBA2 spaced apart from the first non-bendable area NBA1 in the first direction DR1, and a bendable area BA defined between the first non-bendable area NBA1 and the second non-bendable area NBA2. The display area DA may be included in the first non-bendable area NBA1. Portions of the non-display area NDA respectively correspond to the second non-bendable area NBA2 and the bendable area BA, and a portion of the non-display area NDA adjacent to the display area DA is included in the first non-bendable area NBA1.

The bendable area BA may be bent such that a bending axis BX is defined along the second direction DR2 orthogonal to the first direction DR1. The second non-bendable area NBA2 faces the first non-bendable area NBA1. The bendable area BA and the second non-bendable area NBA2 may have a width of the second direction DR2 less than that of the first non-bendable area NBA1. For example, the display device DD shown in FIG. 1 may also include a bendable area corresponding to the bendable area BA.

The width of the bendable area BA and the width of the second non-bendable area NBA2 may be less than the width of the first non-bendable area NBA1 in one direction (for example, the second direction DR2).

A groove GRV exposing the non-display area NDA of the base layer SUB may be defined in the buffer film BFL and the first and second intermediate inorganic films 10 and 20 of the bendable area BA. A dummy organic pattern DOP may be disposed inside the groove GRV. As the inorganic film is removed in the bendable area BA, stress of the bendable area BA may be reduced, and a crack of the first and second intermediate inorganic films 10 and 20 may be prevented.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a first layer having a display area including pixels and a non-display area surrounding the display area;
   a second layer disposed on the first layer and including an intermediate inorganic film and an intermediate organic film, the intermediate inorganic film overlapping the display area and the non-display area, the intermediate organic film disposed on the intermediate inorganic film and exposing a portion of the intermediate inorganic film in the non-display area;
   a third layer disposed on the second layer and including display elements in the display area;
   a first dam structure disposed outside an edge of the intermediate organic film and extending along the edge of the intermediate organic film;
   a fourth layer including a first encapsulation inorganic film and a second encapsulation inorganic film overlapping the third layer and the first dam structure, respectively, and an encapsulation organic film interposed between the first encapsulation inorganic film and the second encapsulation inorganic film and having an end portion adjacent to a side of the first dam structure;
   a fifth layer in disposed on the fourth layer;
   a sixth layer disposed on the fifth layer and including a light blocking layer, a plurality of color filters, and a seventh layer covering the light blocking layer and the plurality of color filters; and
   a second dam structure disposed on the non-display area and defining a boundary of the seventh layer,
   wherein each pixel comprises:
      a first sub pixel to emit a first color light;
      a second sub pixel to emit a second color light; and
      a third sub pixel to emit a third color light, and
   wherein the color filters comprise:
      a first color filter overlapping the first sub pixel;
      a second color filter overlapping the second sub pixel; and
      a third color filter overlapping the third sub pixel,
   wherein the second dam structure comprises an eighth layer, a ninth layer, a tenth layer and an eleventh layer, and wherein:
   the eighth layer includes the same material as the light blocking layer,
   the ninth layer includes the same material as the first color filter, the tenth layer includes the same material as the second color filter, and the eleventh layer includes the same material as the third color filter.

2. The display device of claim 1, wherein the seventh layer has a greater thickness than each of the first through sixth layers.

3. The display device of claim 2, wherein a portion of the first dam structure and a portion of the second dam structure are disposed substantially in parallel with a pad area.

4. The display device of claim 2, wherein the second dam structure is disposed between the display area and with a pad area.

5. The display device of claim 4, wherein the first dam structure and the second dam structure have respective flat bottom surfaces that are at a same height above the third layer, wherein the first dam structure and the second dam structure have respective flat top surfaces, and wherein the second dam structure has a greater length from its flat bottom surface to its flat top surface than the first dam structure.

6. The display device of claim 1, wherein the first color filter is a green color filter, the second color filter is a blue color filter, and the third color filter is a red color filter.

7. The display device of claim 1, wherein the seventh layer is an overcoat layer further comprising a scatterer formed of at least one selected from $Al_2O_3$, and $SiO_2$.

8. The display device of claim 1, wherein the third layer comprises a display element layer further comprising a pixel definition film having an opening defining an emission area.

9. The display device of claim 8, further comprising:

a spacer projecting in a thickness direction from the pixel definition film, wherein the first dam structure comprises an eighth layer and a ninth layer, the eighth layer simultaneously formed of the same material as the pixel definition film, the ninth layer simultaneously formed of the same material as the spacer.

10. The display device of claim 8, wherein the light blocking layer overlaps the pixel definition film in a thickness direction.

11. The display device of claim 8, wherein the light blocking layer has a first width between its ends in one direction, the pixel definition film has a second width between its ends in the one direction, and the first width is less than the second width.

12. The display device of claim 8, wherein the pixel definition film comprises a light absorbing material, and the light absorbing material comprises at least one selected from, chromium (Cr), molybdenum (Mo), an alloy of molybdenum and titanium (MoTi), tungsten (W), vanadium (V), niobium (Nb), tantalum (Ta), manganese (Mn), cobalt (Co), and nickel (Ni).

13. The display device of claim 1, wherein the intermediate organic film comprises a first intermediate organic film disposed on the intermediate inorganic film, and a second intermediate organic film disposed on the first intermediate organic film.

14. The display device of claim 1, wherein the non-display area comprises a first non-bendable area, a second non-bendable area spaced apart from the first non-bendable area in a first direction, and a bendable area defined between the first non-bendable area and the second non-bendable area, and wherein the bendable area is bent such that a bending axis is defined along a second direction orthogonal to the first direction.

15. The display device of claim 14, wherein the intermediate inorganic film has a groove that exposes a portion of the non-display area of the first layer, and a dummy organic pattern is disposed inside the groove.

16. The display device of claim 14, wherein the second layer is a circuit element layer and comprises signal lines electrically connected to the display elements, and signal pads connected to ends of the signal lines, and the second non-bendable area comprises a pad area in which the signal pads are disposed.

17. The display device of claim 16, wherein the second dam structure is disposed in the first non-bendable area.

18. The display device of claim 17, wherein the second dam structure comprises a first dam portion and the second dam structure comprises a second dam portion overlapping the first dam portion.

* * * * *